(12) United States Patent
Falk et al.

(10) Patent No.: US 12,197,104 B2
(45) Date of Patent: Jan. 14, 2025

(54) ELECTRO-OPTIC TRANSDUCER WITH INTEGRATED OPTICAL DELAY LINE

(71) Applicant: International Business Machines Corporation, Armonk, NY (US)

(72) Inventors: Abram L Falk, Port Chester, NY (US); Chi Xiong, Yorktown Heights, NY (US); Ryan Daniel Schilling, New York, NY (US); Jason S. Orcutt, Katonah, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 154 days.

(21) Appl. No.: 18/062,883

(22) Filed: Dec. 7, 2022

(65) Prior Publication Data
US 2024/0195512 A1    Jun. 13, 2024

(51) Int. Cl.
*G02F 1/365* (2006.01)
*G02F 1/35* (2006.01)
(Continued)

(52) U.S. Cl.
CPC ............ *G02F 1/365* (2013.01); *G02F 1/3534* (2013.01); *G02F 1/3551* (2013.01);
(Continued)

(58) Field of Classification Search
CPC .... G02F 1/3534; G02F 1/3551; G02F 1/3556; G02F 1/365; H01S 3/094092; H04B 10/70; G06N 10/00
See application file for complete search history.

(56) References Cited

U.S. PATENT DOCUMENTS 7,587,144 B2 * 9/2009 Ilchenko ................ H04B 10/60
                                                                  398/115
9,927,636 B2   3/2018 Bishop et al.
(Continued)

FOREIGN PATENT DOCUMENTS

DE    112017001164 T5    11/2018
WO    2022020951 A1      2/2022

OTHER PUBLICATIONS

McKenna, et al., "Cryogenic microwave-to-optical conversion using a triply resonant lithium-niobate-on-sapphire transducer," Optica vol. 7, Issue 12, pp. 1737-1745 (2020) https://doi.org/10.1364/OPTICA.397235.
(Continued)

*Primary Examiner* — Daniel Petkovsek
(74) *Attorney, Agent, or Firm* — Amin, Turocy & Watson, LLP

(57) ABSTRACT

Devices and/or methods provided herein relate to providing conversion of photons between an optical domain and a microwave domain. An electronic structure can comprise a resonator assembly comprising a microwave resonator and an optical resonator, an optical pump waveguide that transmits an optical pump input to the resonator assembly, and an optical signal waveguide, separate from the optical pump waveguide, that transmits an optical signal relative to the resonator assembly. The electronic structure further can comprise a microwave signal waveguide that transmits a microwave signal relative to the resonator assembly. The optical pump waveguide can comprise a delay portion that delays receipt of the optical pump input to the resonator assembly through the optical pump waveguide to a time after reduction of a majority of decoherence of the resonator assembly caused by scattering of a portion of the optical
(Continued)

pump input, which portion does not enter the optical pump waveguide.

20 Claims, 10 Drawing Sheets

(51) Int. Cl.
*G02F 1/355* (2006.01)
*H01S 3/094* (2006.01)
*H04B 10/70* (2013.01)
*G06N 10/00* (2022.01)

(52) U.S. Cl.
CPC ...... *G02F 1/3556* (2013.01); *H01S 3/094092* (2013.01); *H04B 10/70* (2013.01); *G06N 10/00* (2019.01)

(56) References Cited

U.S. PATENT DOCUMENTS

| | | | |
|---|---|---|---|
| 10,295,582 | B2 | 5/2019 | Bishop et al. |
| 10,672,971 | B2 | 6/2020 | Brink et al. |
| 10,782,590 | B2 | 9/2020 | Witmer et al. |
| 11,005,574 | B2 | 5/2021 | Bronn et al. |
| 11,537,026 | B2* | 12/2022 | Zhang ............... G02F 1/3536 |
| 2015/0060756 | A1* | 3/2015 | Park ..................... B82Y 20/00 |
| | | | 257/9 |
| 2017/0248832 | A1* | 8/2017 | Kippenberg ............ G02F 1/353 |
| 2017/0261770 | A1 | 9/2017 | Bishop et al. |
| 2018/0113373 | A1 | 4/2018 | Witmer et al. |
| 2019/0296210 | A1 | 9/2019 | Brink et al. |
| 2021/0048726 | A1* | 2/2021 | Orcutt .................... G02F 1/353 |
| 2022/0146905 | A1 | 5/2022 | Falk et al. |
| 2022/0285818 | A1 | 9/2022 | Falk et al. |
| 2023/0145368 | A1 | 5/2023 | Xiong et al. |
| 2023/0314717 | A1* | 10/2023 | Kudalippalliyalil ... G06N 10/40 |
| | | | 385/27 |
| 2024/0337896 | A1 | 10/2024 | Falk et al. |

OTHER PUBLICATIONS

Witmer, et al., "A silicon-organic hybrid platform for quantum microwave-to-optical transduction," Quant Sci Tech. 5 034004 (2020).

Holzgrafe, et al., "Cavity electro-optics in thin-film lithium niobate for efficient microwave-to-optical transduction," Optica vol. 7, Issue 12, pp. 1714-1720 (2020) https://doi.org/10.1364/OPTICA.397513.

Orcutt, et al., "Engineering electro-optics in SiGe/Si waveguides for quantum transduction," Quantum Sci. Technol. 5 034006, Published May 5, 2020.

Fu, et al., "Ground-state Pulsed Cavity Electro-optics for Microwave-to-optical Conversion," arXiv:2010.11392v1 [quant-ph] Oct. 22, 2020.

Xiong, et al., "Microwave-to-Optical Quantum Transducers," U.S. Appl. No. 17/191,178, filed Mar. 3, 2021.

Crescini, et al., "Dual-Sideband Microwave Interferometer," U.S. Appl. No. 17/562,391, filed Dec. 27, 2021.

* cited by examiner

ELECTRO-OPTIC TRANSDUCER WITH INTEGRATED OPTICAL DELAY LINE

FIELD OF THE INVENTION

The present disclosure relates generally to conversion of photons between a microwave domain and an optical domain, and, more particularly, to a transducer for converting microwave signals to optical signals or vice versa.

BACKGROUND

Various communication protocols rely on optical fibers because of their low loss, high bandwidth, low background noise, and the ease of routing. Optical fibers can also be used for sending quantum information in the form of single photons or coherent states. On the other hand, many viable quantum processing architectures operate at microwave frequencies. The high amplitude stability of microwave structures can allow for precise controls on quantum bits (qubits) that can enable high-fidelity gate operations. However, microwave photons are more difficult to use for long-range communication purposes, due to high thermal background noise and high loss when such signals propagate in waveguides.

Existing approaches to converting between microwave signals and optical signals are complicated, difficult to implement in solid state systems and/or difficult to optimize. This can include early microwave resonator degradation and/or microwave resonator decoherence which can be caused by stray optical photons from a respective optical pump. These stray photons can couple to a substrate of the resonator and can be long-lived, causing decoherence issues during conversion of photons between the microwave domain and the optical domain.

SUMMARY

The following presents a summary to provide a basic understanding of one or more embodiments described herein. This summary is not intended to identify key or critical elements, delineate scope of embodiments or scope of claims. Its sole purpose is to present concepts in a simplified form as a prelude to the more detailed description that is presented later. In one or more embodiments described herein, systems, methods and/or apparatuses can facilitate a process to provide conversion of photons between a microwave domain and an optical domain.

In accordance with one or more embodiments, an electronic structure can comprise a resonator assembly comprising a microwave resonator and an optical resonator, an optical pump waveguide that transmits an optical pump input to the resonator assembly, and an optical signal waveguide, separate from the optical pump waveguide, that transmits an optical signal relative to the resonator assembly.

An advantage of the aforementioned electronic structure can be an ability to separate input/output microwave signals and input/output optical signals to the resonator assembly, while also separating the optical input line from the optical pump to the resonator assembly. In this way, signal loss can be reduced and/or prevented by separate transmission lines being employed.

In one or more embodiments, the electronic structure further can comprise a microwave signal waveguide that transmits a microwave signal relative to the resonator assembly.

In one or more embodiments, the optical pump waveguide can comprise a delay portion that delays receipt of the optical pump input to the resonator assembly through the optical pump waveguide to a time after reduction of a majority of decoherence and/or other detrimental effects at the resonator assembly caused by a scattering of a portion of the optical pump input, which portion does not enter the optical pump waveguide.

An advantage of the aforementioned electronic structure can be an ability to allow for reduction of decoherence at the resonator assembly deriving from quasiparticles created by scattering of optical pump input prior to a majority of the optical pump input reaching the resonator assembly through the optical pump waveguide. This can allow for use of a higher peak-power optical pulse, which in turn can increase efficiency of the electronic structure (e.g., an electro-optic transducer). As used herein, transducer efficiency can refer to a ratio of power output to the total power input. Put another way, transducer efficiency can refer to a percentage of photons (microwave or optical) having a frequency that successfully is converted by the electronic structure (e.g., an electro-optic transducer).

In accordance with another embodiment, a method for transmissively coupling a pair of devices can comprise inputting an optical pump input through an optical pump waveguide to a resonator assembly, wherein the resonator assembly comprises a microwave resonator and an optical resonator, and transmitting through an optical signal waveguide, separate from the optical pump waveguide, an optical signal relative to the resonator assembly.

An advantage of the aforementioned method can be an ability to separate input/output microwave signals and input/output optical signals to the resonator assembly, while also separating the optical input line from the optical pump to the resonator assembly. In this way, signal loss can be reduced and/or prevented by separate transmission lines being employed.

In one or more embodiments, the method further can comprise transmitting through a microwave signal waveguide a microwave signal relative to the resonator assembly.

In one or more embodiments, the method can comprise receiving at the resonator assembly the optical pump input through the optical pump waveguide at a time after reduction of a majority of decoherence of the resonator assembly caused by a scattering of a portion of the optical pump input, which portion does not enter the optical pump waveguide.

An advantage of the aforementioned method can be an ability to allow for reduction of decoherence at the resonator assembly deriving from quasiparticles created by scattering of optical pump input prior to a majority of the optical pump input reaching the resonator assembly through the optical pump waveguide. This can allow for use of a higher peak-power optical pulse, which in turn can increase efficiency of the electronic structure (e.g., an electro-optic transducer).

In accordance with still another embodiment, an electronic system can comprise a first transducer comprising a first resonator assembly comprising a microwave resonator and an optical resonator, and a first optical pump waveguide configured to transmit only optical pump inputs to the first resonator assembly.

An advantage of the aforementioned electronic system can be an ability to separate input/output microwave signals and input/output optical signals to the resonator assembly, while also separating the optical input line from the optical pump to the resonator assembly. In this way, signal loss can be reduced and/or prevented by separate transmission lines being employed.

In one or more embodiments, the electronic system can further comprise a second transducer comprising a second resonator assembly comprising a microwave resonator and an optical resonator, and a second optical pump waveguide configured to transmit only second optical pump inputs to the second resonator assembly, and a coupling line coupling the first resonator assembly to the second resonator assembly.

An advantage of such electronic system can be an ability to transmit optical signals between a pair of computer devices, such as a pair of quantum computers, and allow for conversion of the optical signals at either computer device to respective microwave domains. The resultant microwave outputs can be employed by the respective computer devices to perform one or more operations, such as one or more quantum operations. The resultant microwave outputs can be obtained absent, and/or with reduced, signal loss in view of the separate transmission lines being employed at each of the first transducer and the second transducer.

In one or more embodiments, the electronic system further can comprise the first optical pump waveguide comprising a serpentine delay portion that is configured to transmit an optical pump input in a time of 5 nanoseconds or greater through the serpentine delay portion.

An advantage of the aforementioned electronic system can be an ability to allow for reduction of decoherence at the resonator assembly deriving from quasiparticles created by scattering of optical pump input prior to a majority of the optical pump input reaching the resonator assembly through the optical pump waveguide. This can allow for use of a higher peak-power optical pulse, which in turn can increase efficiency of the first transducer.

DETAILED DESCRIPTION

Figure 1:
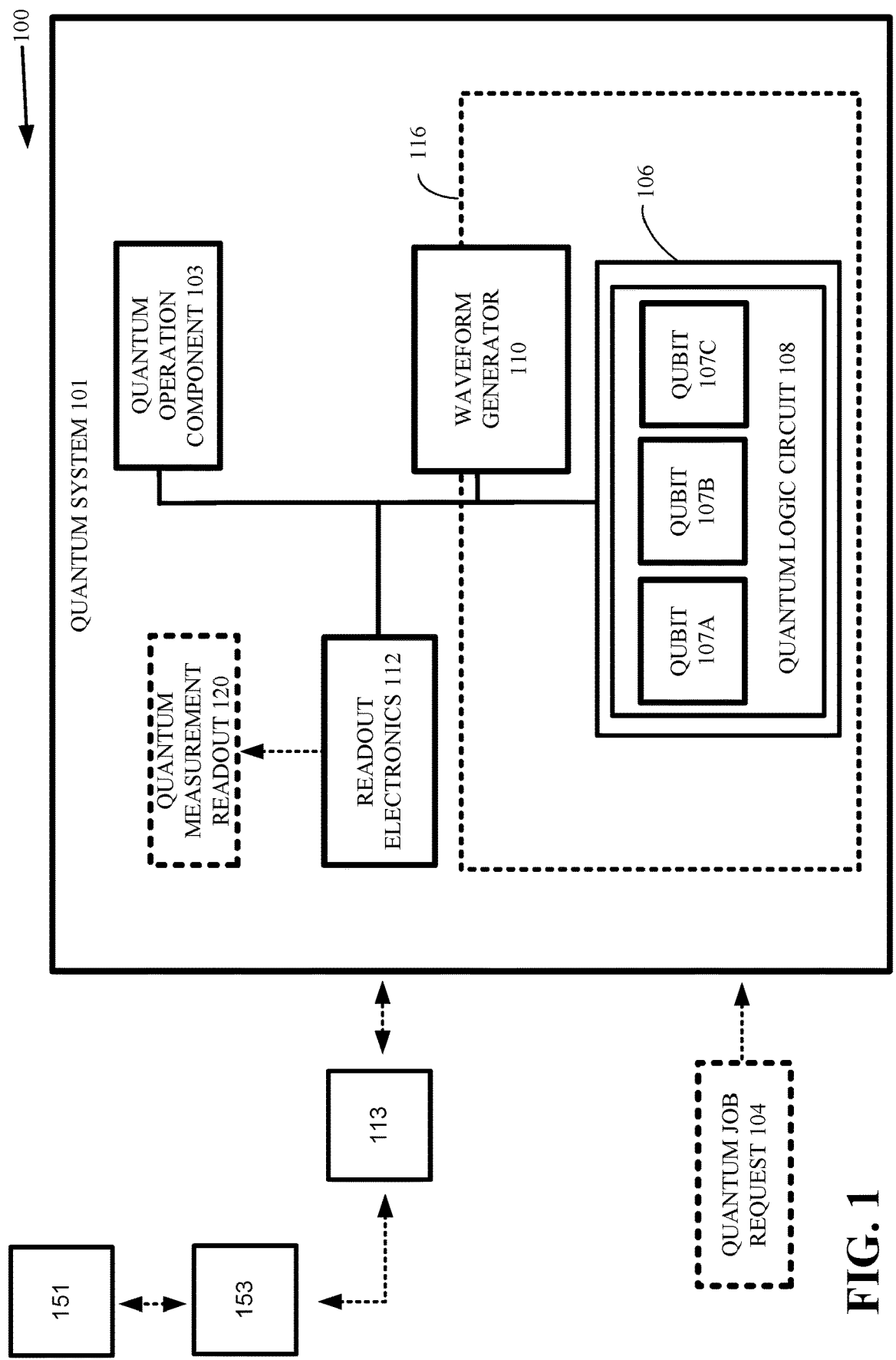
FIG. 1 illustrates a block diagram of an example, non-limiting system that can facilitate measurement readout from one or more qubits, in accordance with one or more embodiments described herein.

The following detailed description is merely illustrative and is not intended to limit embodiments and/or application or utilization of embodiments. Furthermore, there is no intention to be bound by any expressed or implied information presented in the preceding Summary section or in the Detailed Description section. One or more embodiments are now described with reference to the drawings, wherein like reference numerals are utilized to refer to like elements throughout. In the following description, for purposes of explanation, numerous details are set forth in order to provide a more thorough understanding of the one or more embodiments. However, in various cases, that the one or more embodiments can be practiced without these details.

Discussion is provided herein relative to a configuration, including fabrication, of an electronic structure that can comprise and/or be comprised by a transducer, such as an electro-optic transducer for use in converting a signal between an optical domain and a microwave domain. In one or more embodiments, the electronic structure can be configured for use in a quantum system, such as for use within a room temperature environment external to a quantum cryogenic unit. However, as there are many used for transducer devices, the discussion herein need not apply solely to quantum computer electronics, but can be applicable to many other control, radio, radar and/or signal-based applications, among others. Description and discussion herein are therefore not limited to use with a quantum system or in the quantum domain only.

Turning first to existing frameworks for transducer fabrication and/or transducer use, such as relative to conversion of signals by such transducers, long-distance networks of superconducting quantum computers can employ quantum transducers that can convert single photons from microwave frequencies up to the infrared telecom domain. Because the energy of a microwave photon is less than the thermal background energy of room temperature, room-temperature quantum information links at microwave frequencies can be either extremely challenging or impossible. Differently, infrared photons can travel long distances in optical fibers without attenuation or interference. Accordingly, information can be transmitted optically, and quantum transducers linked to other superconducting quantum processors can convert a photon from an infrared or other optical domain back to the microwave domain.

Existing frameworks can include using electro-optics, whereby a microwave resonator and an optical resonator can be constructed to have overlapping fields in the presence of a nonlinear optical medium. If this medium has a nonzero electro-optic susceptibility tensor ($x^{(2)}$ tensor), then up-conversion or down-conversion can occur via three-wave mixing, whereby an optical pump beam and a single microwave (optical) photon mixes with an optical pump to be up-converted (down-converted) to the optical (microwave) domain. For centrosymmetric materials, which are characterized by $x^{(2)}=0$, a $x^{(3)}$ tensor can be used instead. Although traditional $x^{(3)}$ nonlinear optics can rely on the mixing of four electromagnetic fields, a DC voltage can substitute for one of these fields, inducing an effective $x^{(2)}$ tensor in the $x^{(3)}$ material.

A driver of efficiency in all electro-optic quantum transducers is the light intensity of a light of the optical pump. Engineering transducers to accept a strong pump intensity is a pathway towards higher efficiency transducers. However, existing transducers fall short in moving towards higher efficiency.

That is, in electro-optic quantum transduction, successful conversion efficiency (either up-conversion of microwave photons to optical photons or down-conversion of optical photons to microwave photons) can be dependent on the intensity of power of the optical pump. For example, if the optical pump intensity could be made arbitrarily high, the efficiency of any electro-optic quantum transducer could approach 100%. As mentioned above, quantum transduction efficiency can refer to a percentage of photons whose frequency successfully gets converted by the transducer.

However, in existing frameworks, the amount of optical power is limited by the fact that infrared radiation incident on the superconducting microwave transducer generates quasiparticles, which can cause the superconductor to effectively become resistive, which in turn can cause the Q factor of the microwave resonator to degrade.

Some degree of quasiparticle generation can be inevitable, as the electro-optic transducer can inherently rely upon an overlap between microwave and optical resonators, and thus the optical field can overlap the superconductor to a degree. In existing frameworks, the quasiparticles generated in the superconductor have primarily derived not from the optical resonator itself but from stray optical photons. These stray photons can derive from coupling of the pump beam to the optical resonator. The transducer chip has an optical coupler that can couple the optical pump input beam into an on-chip optical pump waveguide, but the efficiency of this coupler often can be less than 100%. Some laser light can scatter into superconducting structures on chip, into free space in the vicinity of the transducer and/or into the substrate. Once photons are coupled to/into the substrate, they can be confined within the substrate via total internal reflection, whereby they can be directed to the superconducting structures on top of the substrate and can become a source of microwave resonator decoherence. That is, this decoherence can be occurring during attempted conversion of photons between the microwave domain and the optical domain, thus causing signal loss and/or signal error.

Furthermore, in existing frameworks, the optical signal waveguide, for propagation of an optical signal to or from the optical resonator, can be coupled to and/or be unitary with the optical pump waveguide. This can cause further disruption, distortion and/or loss of the optical signal and/or optical pump input.

To account for one or more of these deficiencies of existing frameworks, one or more embodiments described herein can provide an overall electronic structure that can be constructed to allow for dissipation of the laser scatter in the substrate and/or for dissipation of the microwave at least prior to, if not fully prior to, the attempted conversion of photons between the microwave domain and the optical domain. That is, one or more embodiments of an electronic structure described herein can integrally incorporate an optical delay portion line into the transducer.

Generally, a pulse of light as optical input from the optical pump can have some laser scatter, but the remaining and majority of the optical pump input pulse of light can propagate through the optical pump waveguide which can comprise a delay portion. While the pulse propagates through the delay portion, the aforementioned affects of the laser scatter can dissipate. When the optical input pulse reaches the optical resonator, the laser scatter in the substrate can have already dissipated. As a result, a higher peak-power optical pulse can be used absent concern for signal loss, signal error and/or conversion failure caused by the laser scatter, which can allow for the transducer to be more efficient.

Generally, an electronic structure described herein can comprise a resonator assembly comprising a microwave resonator and an optical resonator. An optical pump waveguide can transmit an optical pump input, from an optical pump, to the resonator assembly. A microwave signal waveguide, separate from the optical pump waveguide, can transmit a microwave signal relative to the resonator assembly (e.g., to or from the resonator assembly). Likewise, an optical signal waveguide, separate from the optical pump waveguide, can transmit an optical signal relative to the resonator assembly (e.g., to or from the resonator assembly). It is these microwave signal and optical signal that can be converted, one to the other, or vice versa, by the transducer. A superconductor, such as at a substrate of the transducer, and at least partially disposed at the resonator assembly, can facilitate this conversion.

As noted, the microwave resonator, the optical resonator, the optical pump waveguide, the optical signal waveguide and the microwave signal waveguide can be aligned adjacent to one another but non-contiguous with one another. This can facilitate separation of optical signals (e.g., the optical signal being converted/from conversion and the optical pump input) and the microwave signal (e.g., the microwave signal being converted/from conversion).

In one or more embodiments, the optical pump waveguide can comprise a delay portion that delays receipt of the optical pump input to the resonator assembly through the optical pump waveguide to a time after reduction of a majority of decoherence of the resonator assembly caused by a scattering of a portion of the optical pump input, which portion does not enter the optical pump waveguide. In one or more embodiments, this delay portion can comprise a serpentine portion. In one or more embodiments, this delay portion can cause delay of the optical input that is at least 5 nanoseconds or greater. This can facilitate allowance of dissipation of decoherence of the resonator assembly (e.g., the microwave resonator thereof) and/or de-coupling of optical pump input light from the substrate.

Accordingly, in use, the one or more frameworks discussed herein can allow for a higher peak-power optical pulse to be used absent concern for signal loss, signal error and/or conversion failure caused by laser scatter of the optical input light/pulse, which can overall allow for the transducer to be more efficient.

As used herein, the term "on" and "above" can be used in a context, as is customary, to indicate orientation or relative position in a vertical or orthogonal direction to the surface of the substrate, for example in a vertical z-direction.

As used herein, the term "lateral" and/or "laterally" can be used, as is customary, to indicate orientation generally parallel to the plane of the substrate, as opposed to generally vertically or outwardly, from the substrate surface.

As used herein, the term "vertical" and/or "vertically" can be used, as is customary, to indicate orientation generally orthogonal (e.g., vertical z-direction) to the plane of the substrate, and thus also in a direction outward from the plane of the substrate, as opposed to generally laterally along the substrate surface.

As used herein, the term "arranged on/at" can be understood in a broad sense and shall include embodiments according to which an intermediate layer, such as an insulating layer, can be arranged between a substrate/ground plane/ground and a respectively described layer/structure. Hence the terms "arranged on" and/or "arranged at" can comprise the meaning of "arranged above".

One or more embodiments are now described with reference to the drawings, where like referenced numerals are used to refer to like elements throughout. As used herein, the terms "entity", "requesting entity" and "user entity" can refer to a machine, device, component, hardware, software, smart device and/or human. In the following description, for purposes of explanation, numerous details are set forth in order to provide a more thorough understanding of the one or more embodiments. However, in various cases, that the one or more embodiments can be practiced without these details.

Generally, the subject computer processing system, methods, apparatuses, devices and/or computer program products can be employed to solve new problems that can arise through advancements in technology, computer networks, the Internet and the like.

Further, the one or more embodiments depicted in one or more figures described herein are for illustration only, and as such, the architecture of embodiments is not limited to the systems, devices and/or components depicted therein, nor to any particular order, connection and/or coupling of systems, devices and/or components depicted therein.

Turning first generally to FIG. 1, one or more embodiments described herein can include one or more devices, systems and/or apparatuses that can facilitate executing one or more operations to facilitate generation of one or more qubit drive, excitation and/or readout pulses (e.g., signals, waveforms and/or wavelets). FIG. 1 illustrates a block diagram of an example, non-limiting system 100 that can facilitate operation of a quantum circuit such as by employing an electronic structure 113 according to the present disclosure. The electronic structure 113 can be employed at an input to the quantum system 101 and/or at any other suitable location internal to and/or external to the quantum system 101.

The following/aforementioned description refer to the operation of a single quantum program from a single quantum job request. This operation can include one or more readouts from cryogenic environment electronics within cryogenic chamber 116 by room temperature control/readout electronics 112 external to the cryogenic chamber 116. That is, one or more of the processes described herein can be scalable, also such as including additionally, and/or alternatively, execution of one or more quantum programs and/or quantum job requests in parallel with one another. Scalability can be enabled by employing electronic structures as described herein in quantity.

For example, as illustrated at FIG. 1, a first electronic structure 113 (e.g., electro-optic transducer) associated with the first quantum system 101 can be coupled (e.g., optically coupled) to a second electronic structure 153 (e.g., electro-optic transducer). The second electronic structure 153 can be associated with a second quantum system 153. These electronic structures 113 and 153 can allow for communication between the quantum systems 101 and 151. For example, microwave signals can be transmitted back and forth between the quantum systems 101 and 151 using the electronic structures 113 and 153.

That is, a microwave signal from the first quantum system 101 can be converted to an optical signal by the first electronic structure 113, whereby the optical signal can be transmitted from the first electronic structure 113 to the second electronic structure 153 using any suitable medium and/or method (e.g., fiberoptic or other optic line). Likewise, a microwave signal from the second quantum system 151 can be converted to an optical signal by the second electronic structure 153, whereby the optical signal can be transmitted from the second electronic structure 153 to the first electronic structure 113 using any suitable medium and/or method (e.g., fiberoptic or other optic line). The optical signals received at the electronic structures 113 and 153 can be converted back to microwave signals by the electronic structures 113 and 153 for further use by the respective quantum systems 101 and 151. That is, quantum processing architectures (e.g., the quantum systems 101 and 151) can operate at and/or using microwave frequencies.

In one or more embodiments, the non-limiting system 100 can be a hybrid system and thus can include both one or more classical systems, such as a quantum program implementation system, and one or more quantum systems, such as the quantum system 101. In one or more other embodiments, the quantum system 101 can be separate from, but function at least partially in parallel with, a classical system.

In such case, one or more communications between one or more components of the non-limiting system 100 and a classical system can be facilitated by wired and/or wireless means including, but not limited to, employing a cellular network, a wide area network (WAN) (e.g., the Internet), and/or a local area network (LAN). Suitable wired or wireless technologies for facilitating the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (Ipv6 over Low power Wireless Area Networks), Z-Wave, an ANT, an ultra-wideband (UWB) standard protocol and/or other proprietary and/or non-proprietary communication protocols.

In one or more other embodiments, the classical system can provide a quantum job request 104, qubit mapping and/or quantum circuit to be executed. Such classical system can analyze the one or more quantum measurement readouts 120. Further, such classical system can manage a queueing of quantum circuits to be operated on the one or more qubits of the quantum logic circuit of a respective quantum system 101.

Figure 10:
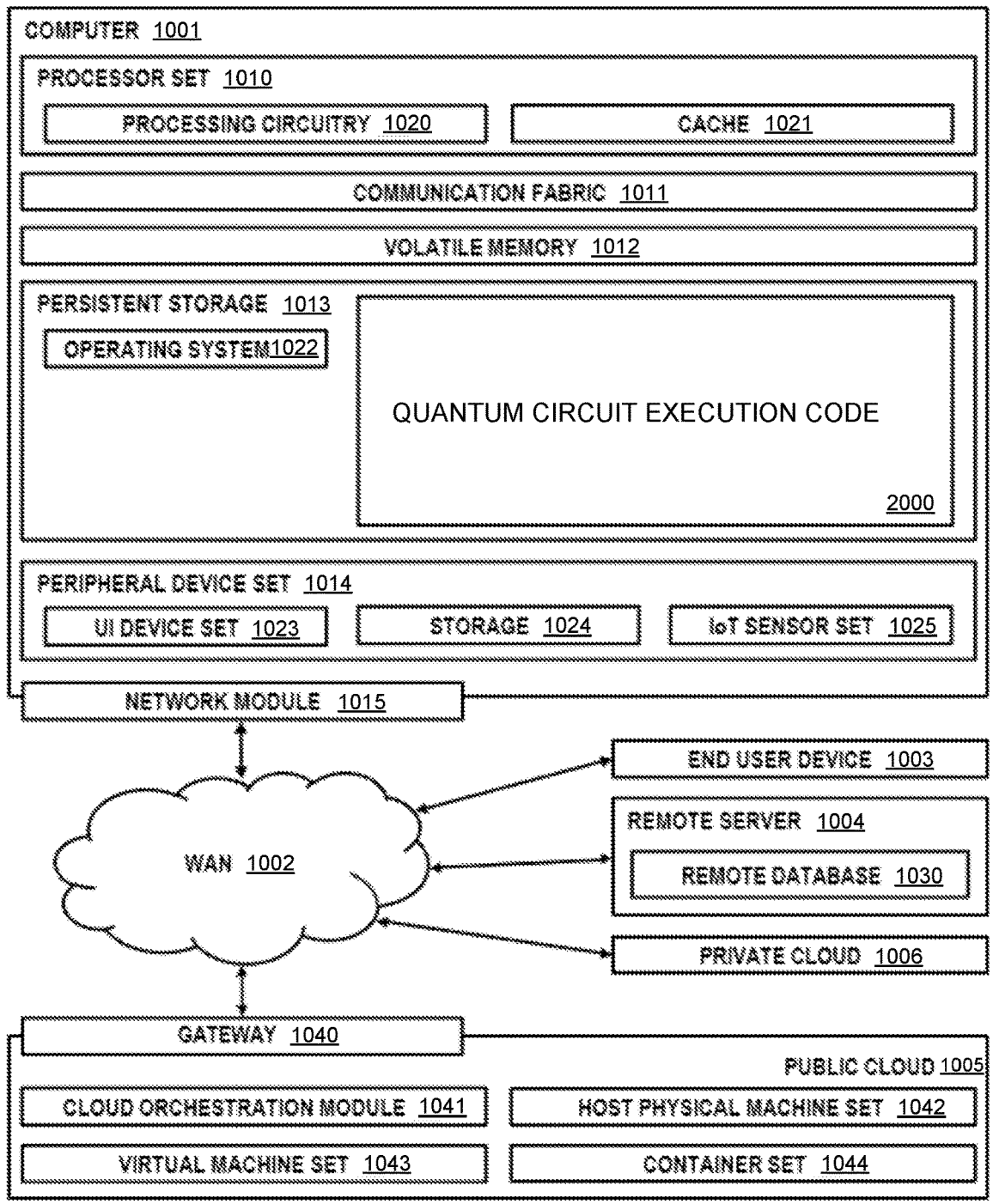
FIG. 10 illustrates a block diagram of example, non-limiting, computer environment in accordance with one or more embodiments described herein.

For example, in one or more embodiments, the non-limiting systems described herein, such as non-limiting system 100 as illustrated at FIG. 1, and/or systems thereof, can further comprise, be associated with and/or be coupled to one or more computer and/or computing-based elements described herein with reference to an operating environment, such as the operating environment 1000 illustrated at FIG. 10. In one or more described embodiments, computer and/or computing-based elements can be used in connection with implementing one or more of the systems, devices, components and/or computer-implemented operations shown and/or described in connection with FIG. 1 and/or with other figures described herein.

The quantum system 101 (e.g., quantum computer system and/or superconducting quantum computer system) can employ quantum algorithms and/or quantum circuitry, including computing components and/or devices, to perform quantum operations and/or functions on input data to produce results that can be output to an entity. The quantum circuitry can comprise quantum bits (qubits), such as multi-bit qubits, physical circuit level components, high level components and/or functions. The quantum circuitry can comprise physical pulses that can be structured (e.g., arranged and/or designed) to perform desired quantum functions and/or computations on data (e.g., input data and/or intermediate data derived from input data) to produce one or more quantum results as an output. The quantum results, e.g., quantum measurement 120, can be responsive to the quantum job request 104 and associated input data and can be based at least in part on the input data, quantum functions and/or quantum computations.

As used herein, a quantum circuit can be a set of operations, such as gates, performed on a set of real-world physical qubits with the purpose of obtaining one or more qubit measurements. A quantum processor can comprise the one or more real-world physical qubits. Operation of a quantum circuit can be facilitated, such as by a waveform generator 110, to produce one or more physical pulses and/or other waveforms, signals and/or frequencies to alter one or more states of one or more of the physical qubits. The altered states can be measured, thus allowing for one or more computations to be performed regarding the qubits and/or the respective altered states. The waveform generator can be controlled, such as by a respective control stage.

In one or more embodiments, the quantum system 101 can comprise one or more quantum components, such as a quantum operation component 103, a quantum processor 106, quantum readout/control electronics 112, the waveform generator 110, and/or a quantum logic circuit 108 comprising one or more qubits (e.g., qubits 107A, 107B and/or 107C), also referred to herein as qubit devices 107A, 107B and 107C.

The quantum processor 106 can be any suitable processor. The quantum processor 106 can generate one or more instructions for controlling the one or more processes of the quantum logic circuit 108 and/or waveform generator 110.

The quantum operation component 103 can obtain (e.g., download, receive and/or search for) a quantum job request 104 requesting execution of one or more quantum programs. The quantum operation component 103 can determine one or more quantum logic circuits, such as the quantum logic circuit 108, for executing the quantum program. The request 104 can be provided in any suitable format, such as a text format, binary format and/or another suitable format. In one or more embodiments, the request 104 can be received by a component other than a component of the quantum system 101, such as a by a component of a classical system coupled to and/or in communication with the quantum system 101.

The waveform generator 110 can perform one or more waveform for operating and/or affecting one or more quantum circuits on the one or more qubits 107A, 107B and/or 107C. For example, the waveform generator 110 can operate one or more qubit effectors, such as qubit oscillators, harmonic oscillators and/or pulse generators to cause one or more pulses to stimulate and/or manipulate the state of the one or more qubits 107A, 107B and/or 107C comprised by the quantum system 101.

One or more physical qubit components (e.g., of the one or more qubits 107A, 107B and/or 107C) can be retained in a stable and static position relative to one another and/or relative to waveform generator electronics, at room temperatures, cryogenic temperatures (e.g., in the milli Kelvin range) and temperatures therebetween. As used herein, room temperature can be between 60 degrees Fahrenheit and 80 degrees Fahrenheit, such as about 70 degrees Fahrenheit.

The waveform generator 110, such as at least partially in parallel with the quantum processor 106, can execute operation of a quantum logic circuit on one or more qubits of the circuit (e.g., qubit 107A, 107B and/or 107C). In response, the quantum operation component 103 can output one or more quantum job results, such as one or more quantum measurements 120, in response to the quantum job request 104.

The quantum logic circuit 108 and a portion or all of the waveform generator 110 and/or quantum processor 106 can be contained in a cryogenic environment, such as generated by a cryogenic chamber 116, such as a dilution refrigerator. Indeed, a signal can be generated by the waveform generator 110 within the cryogenic chamber 116 to affect the one or more qubits 107A-C. Where qubits 107A, 107B and 107C are superconducting qubits, cryogenic temperatures, such as about 4K or lower can be employed to facilitate function of these physical qubits. Accordingly, the elements of the waveform generator 110 also are to be constructed to perform at such cryogenic temperatures.

Turning now to FIGS. 2-7, illustrated are enlarged views of varying embodiments of electronic structures (e.g., electro-optic transducers and/or portions thereof) formed during one or more stages of fabrication methods according to embodiments of the present disclosure. Such electronic structures can be employed as the first electronic structure 113 and/or second electronic structure 153, as described above relative to a first quantum system 101 and/or a second quantum system 151, respectively, and/or can be employed as an electronic structure for other suitable transducer-based purposes, such as signal-based purposes and/or signal-generating purposes.

Generally, each of the electronic structures discussed herein comprises a substrate, such as a silicon or sapphire chip, a resonator assembly and an optical pump waveguide that receives an optical input (e.g., laser input) from an optical pump or other source of light. As described below, the optical pump can be separate from the electronic structures. However, in one or more embodiments, an electronic structure as described herein further can include a respective optical pump.

It is appreciated that each electronic structure embodiment described below can comprise different aspects from one or more other embodiments and that one or more teachings described relative to any one electronic structure embodiment can be applied to any one or more other electronic structure embodiments.

It is appreciated that the figures referenced provide but single illustrations of electronic structures. Thus, in use, an electronic structure described can be scalable to include one or more additional or fewer components, component shapes, component locations and/or component dimensions.

Furthermore, any two or more of the embodiments described herein can be used at least partially in parallel with one another. For example, an electronic structure 200 can be employed at a same system (e.g., at least partially quantum-based system) as an electronic structure 500 and/or 600, and indeed can be at least optically coupled to the electronic structure 500 and/or 600 to allow for transmission therebetween.

Figure 2:
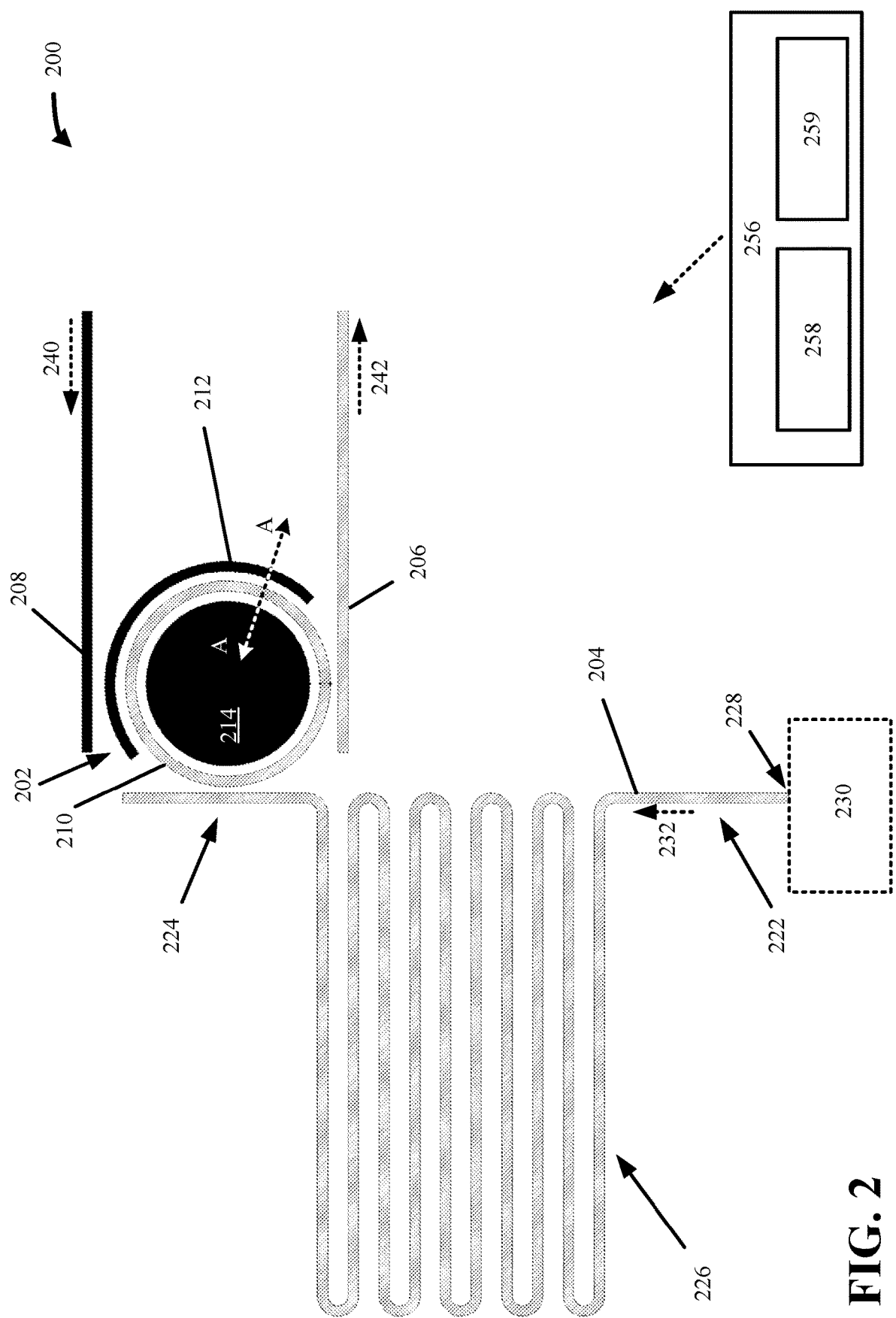
FIG. 2 illustrates an electronic structure, in accordance with one or more embodiments described herein.

Turning now to FIG. 2, but being applicable to any of FIGS. 2-7 and to any electronic structure 200, 500 and/or 600, in one or more embodiments, one or more operations for fabricating the one or more electronic structures described herein, such as the electronic structure 200, can be performed by a manufacturing system, such as a manufacturing system 256 (also herein referred to as fabrication system 256) comprising one or more manufacturing devices 258, where the manufacturing system 256 is operatively coupled to a processor 259 for at least partially controlling the one or more operations. The processor 259 can be any suitable processor. Discussion proved below with respect to processor 1010 can be at least partially equally applicable to the processor 259.

In one or more embodiments, the manufacturing system 256 can be configured, such as by one or more operations performed by one or more of the manufacturing devices 258 in view of one or more instructions provided by the processor 259, to construct the electronic structure 200, such as relative to and/or on a substrate. The one or more manufacturing devices 258 can, perform, among other operations, one or more deposition, transfer, etching, cutting, placement, alignment, removal, radiation, irradiation, adhesive operations, metallization operations, welding such as explosion welding, electroplating and/or other plating methods, component embedding, component location and/or fastener attachment.

Figure 3:
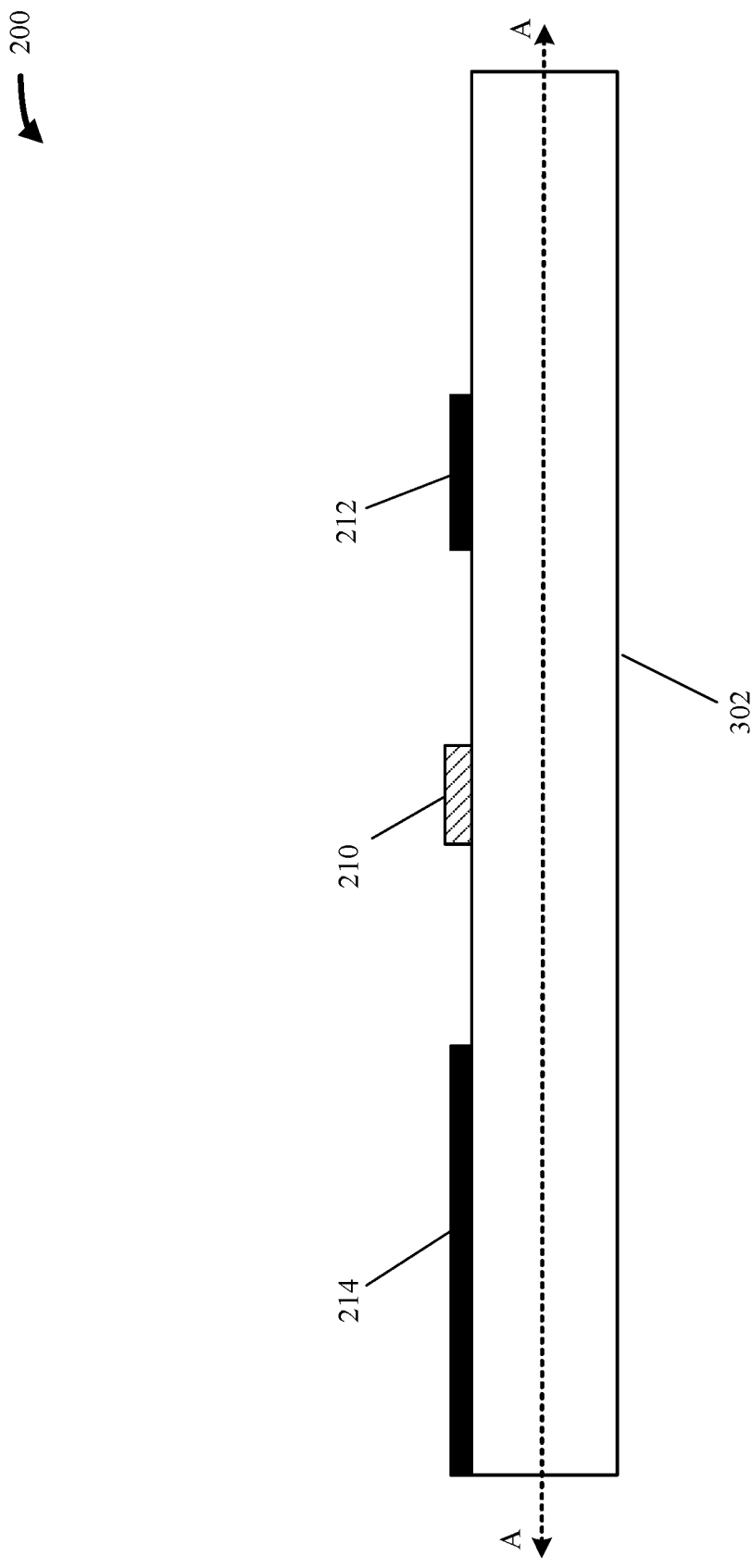
FIG. 3 illustrates another view of the electronic structure of FIG. 2, in accordance with one or more embodiments described herein.

Turning next to FIGS. 2 and 3, an electronic structure 200 such as an electro-optic transducer is illustrated. FIG. 2 illustrates a top view of the electronic structure 200 while FIG. 3 illustrates a cross-sectioned partial side view of the electronic structure 200 taken at line A-A of FIG. 2.

The electronic structure 200 can comprise a substrate 302, resonator assembly 202, optical pump waveguide 204, microwave signal waveguide 208 and optical signal waveguide 206.

The resonator assembly 202 can comprise a microwave resonator 212 and an optical resonator 210. The optical resonator 210 can at least partially, such as fully, encircle a portion 214 of a ground plane of the electronic structure 200. The optical resonator 210 is disposed adjacent but spaced from the optical signal waveguide 206. The microwave resonator 212 can partially encircle the optical resonator 210 and is positioned adjacent, but spaced from, the microwave signal waveguide 208.

The ground plane can be comprised by a superconductor of the electronic structure 200, such as a superconducting film. The purpose of the superconductor is to guide microwaves. It is the material that forms the microwave waveguides and the microwave resonator.

As illustrated by the arrows 240 and 242, the microwave signal waveguide 208 can receive a microwave signal (e.g., microwave photon) 240 for being converted to an optical signal (e.g., optical photon) 242 that is propagated away from the resonator assembly 202 by the optical signal waveguide 206. That is, the electronic structure 200 can be configured to upconvert a microwave signal to an optical domain. In one or more other embodiments, where the arrows 240 242 are reversed, the electronic structure 200 can facilitate downconversion of an optical signal to a microwave domain.

As illustrated, each of the microwave resonator 212, the optical resonator 210, the optical pump waveguide 204, the optical signal waveguide 206 and the microwave signal waveguide 208 are aligned adjacent to one another but are non-contiguous with one another. Further, as illustrated, the microwave signal waveguide 208 is completely separate from the optical pump waveguide 204. In this way, propagation of the microwave signal 240 is completely separate from propagation of an optical pump input 232 from the optical pump 230 or other source of light. It is noted that the optical pump 230 can be off-chip (e.g., off of the substrate 302).

An advantage of the aforementioned electronic structure 200 therefore can be an ability to separate input/output microwave signals and input/output optical signals to the resonator assembly, while also separating the optical input line from the optical pump to the resonator assembly. In this way, signal loss can be reduced and/or prevented by separate transmission lines being employed.

Turning briefly to FIG. 3, in one or more embodiments, the optical pump waveguide 204, and indeed each of the other waveguide and resonator components, can be aligned at a surface of a substrate 302. In one or more embodiments, the substrate 302 can comprise sapphire, silicon and/or silicon nitride (SiN). The ground plane 214 and/or microwave resonator 212 can comprise superconductors such as niobium (Nb), niobium nitride (NbN), and/or niobium titanium nitride (NbTiN). The optical pump waveguide 204, optical signal waveguide 206 and/or optical resonator 210 can comprise lithium niobate ($LiNbO_3$).

Turning again specifically to FIG. 2, as illustrated, the optical pump waveguide 204 can comprise a delay portion 226 that delays receipt of the optical pump input 232 to the resonator assembly 202 through the optical pump waveguide 204. That is, upon input (e.g., coupling) of the optical pump input 232 (e.g., laser pulse) to the input end 222 of the optical pump waveguide 204 by the optical pump 230, a portion of the optical pump input 232 can scatter away from the optical pump/optical pump waveguide interface 228. This laser scatter can affect, such as couple to the ground plane 214 and/or microwave resonator 212, causing microwave resonator decoherence. It is noted that such laser scatter can be present, even with an optical coupler coupling together the optical pump waveguide 204 and the optical pump 230 at the interface 228.

Nonetheless, by integration of the delay portion 226 into the optical pump waveguide 204, propagation of the optical pump input 232 to the resonator assembly 202 (e.g., through the delay portion 226 and the optical pump waveguide 204, to the output end 224 of the optical pump waveguide 204) can be delayed to a time after reduction of a majority of decoherence of the resonator assembly 202 (e.g., of the microwave resonator 212) caused by a scattering of a portion of the optical pump input 232, which portion does not enter the optical pump waveguide 204. It is noted that the output end 224 of the optical pump waveguide 204 is disposed adjacent the resonator assembly 202, such as directly adjacent the optical resonator 210.

In one or more embodiments, delay portion 226 coupling the input end 222 of the optical pump waveguide 204 and the output end 224 of the optical pump waveguide 204 can be configured, such as shaped (e.g., by shape, dimensioning, outer periphery, outer diameter and/or length) to cause propagation of the optical pump input 232 in a time range of about 1 nanosecond (ns) to about 100 ns, such as about 5 ns or such as about 10 ns through the delay portion 226. This delay time can allow for the dissipation of the decoherence of the resonator assembly 202.

In one or more embodiments, such as shown at FIG. 2, the delay portion 226 can be and/or can comprise a serpentine portion. Additionally, and/or alternatively, the delay portion 226 can have any other suitable shape and/or any other suitable shape orientation relative to the optical pump 230 and/or resonator assembly 202 along the substrate 302.

In view of the integration of the delay portion 226, an advantage of the electronic structure 200 can be an ability to allow for reduction of decoherence at the resonator assembly 202 deriving from quasiparticles created by scattering of optical pump input prior to a majority of the optical pump input 232 reaching the resonator assembly 202 through the optical pump waveguide 204.

That is, optical pump laser photons on either the superconducting transmission lines or superconducting ground plane, such as including the microwave resonator 212, microwave signal waveguide 208 and ground plane 214 can create quasiparticles, which can then negatively effect the coherence of the microwave resonator 212. Pump photons incident on the substrate 302 do not directly create quasi-particles, but once pump photons are in the substrate 302, they can be directed to the superconducting structures 208, 212 and/or 214.

Accordingly, integration of the delay portion 226 can account for such negative effects to coherence of the microwave resonator 212, and as a result of the integration, can allow for use of a higher peak-power optical pulse (e.g., optical pump input 232), which in turn can increase efficiency of the electronic structure (e.g., an electro-optic transducer) 202.

To provide a summary of the electronic structure 200, the electronic structure 200 can be and/or can be comprised by a transducer, such as a quantum transducer, at which a superconducting resonator 214 is coupled to an optical resonator 210 that is coupled to an off-chip source of light (e.g., optical pump 230) through an on-chip optical pump waveguide 204.

The optical pump waveguide 204 can be a low-loss integrated waveguide. For example, a $LiNbO_3$ optical pump waveguide fabricated on a sapphire or Si/SiN substrate can be extremely low loss at telecom frequencies such as at about 2.7 decibels per meter (dB/m) and can have a high $x^{(2)}$ tensor.

Once the optical pump input 232 light has propagated through the optical delay line (e.g., optical pump waveguide 204 comprising the delay portion 226), the light reaches the optical resonator 210 which can comprise a $x^{(2)}$ medium such as $LiNbO_3$ or a $x^{(3)}$ medium such as $Si_{1-x}Ge_x$, which is coupled to a superconducting microwave resonator 214, such as by the substrate 302. Relative to $Si_{1-x}Ge_x$, x can comprise the percentage of the alloy that is germanium.

Figure 6:
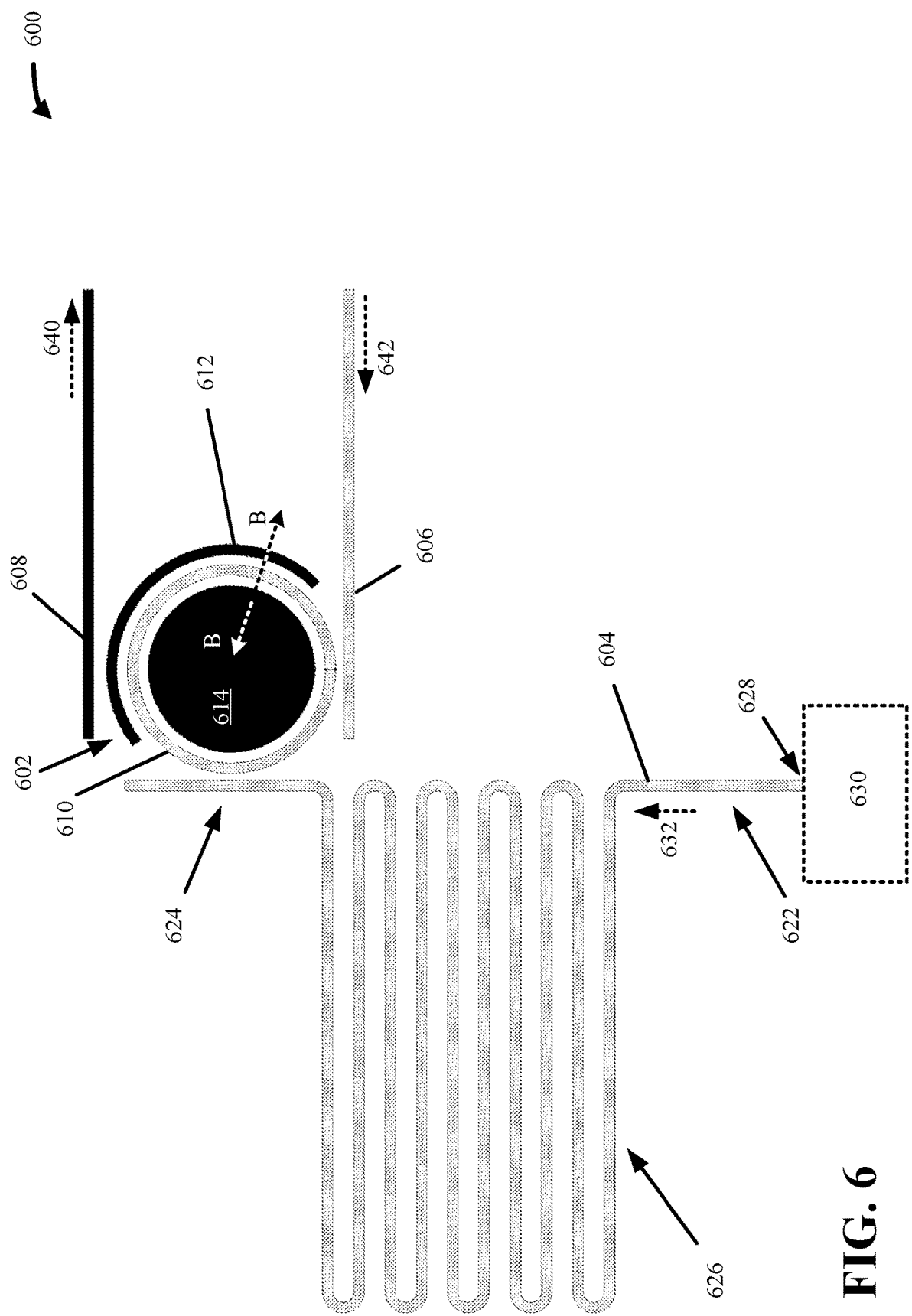
FIG. 6 illustrates still another electronic structure, in accordance with one or more embodiments described herein.

As illustrated at FIG. 2, a signal microwave photon 240 is fed into the superconducting transducer 200, timed to coincide with the arrival of the optical pulse 232. Through the $x^{(2)}$ or $x^{(3)}$ nonlinear optical processes, the input photons can mix the pump optical photons, resulting in the creation of sum- or difference-frequency photons. For the case of sum-frequency photon generation, the signal microwave photon 240 can then be upconverted to the optical domain. Alternatively, for the case of difference-frequency photon generation, as shown at FIG. 6 or by reversing the direction of arrows 240, 242, a signal optical photon can be fed into the transducer, timed to coincide with the arrival of the optical pump signal pulse 232. The signal optical photon can then be downconverted to the microwave domain.

Figure 4:
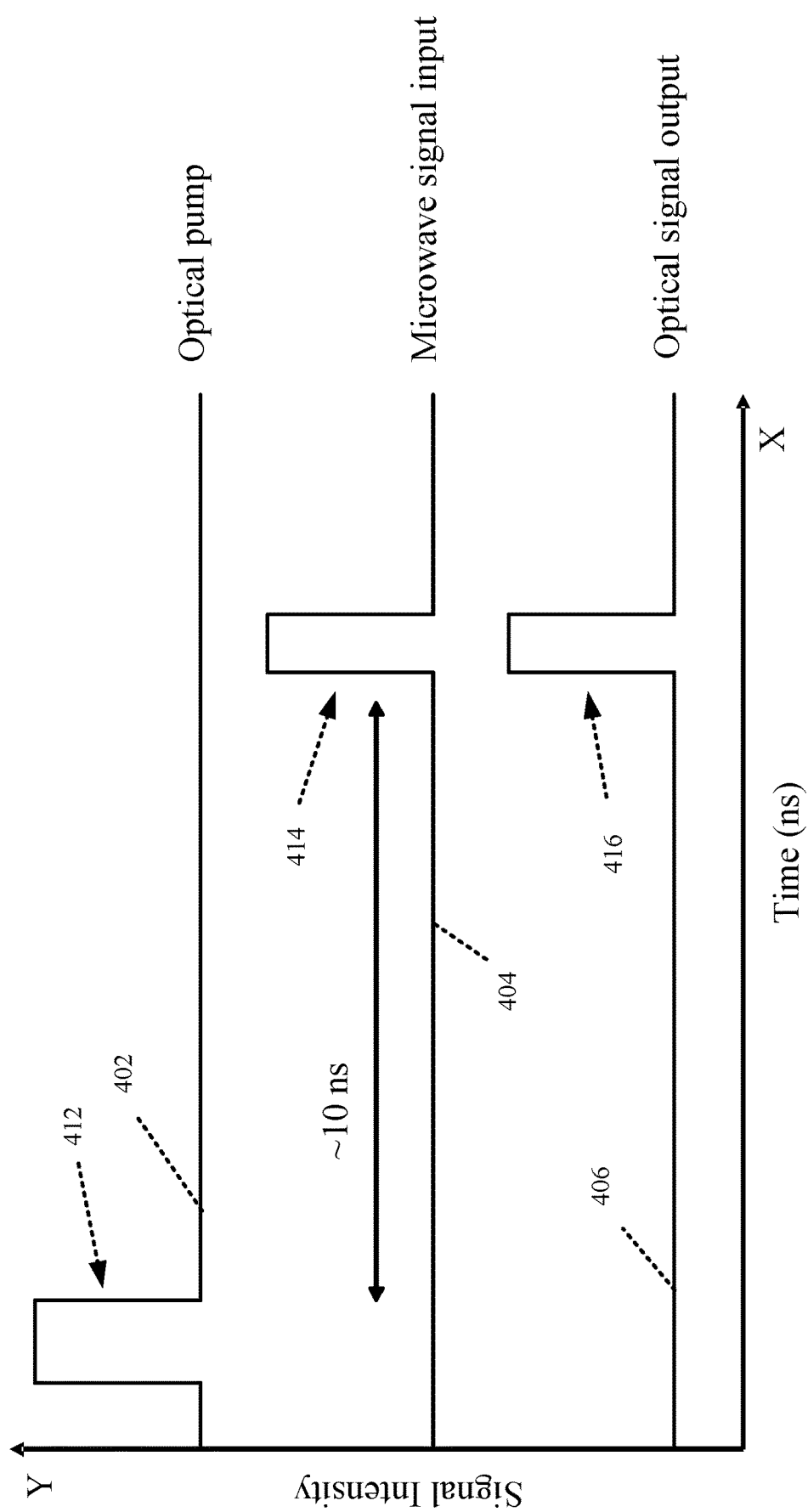
FIG. 4 illustrates a timing diagram demonstrating timing of input photons and output photons at the electronic structure of FIG. 2 relative to a respective optical pump, in accordance with one or more embodiments described herein.

Turning next to FIG. 4, illustrated is a timing diagram 400 illustrating relative timing of input photons and output photons at the transducer 200 relative to a respective optical pump. As shown, timing on the x-axis is illustrated in units of nanoseconds and signal intensity on the y-axis is illustrated in units of optical power (e.g. milli-watts). It is noted that the timing diagram 400 likewise can apply to the electronic structures 500 and/or 600 discussed below.

At FIG. 4, it is illustrated that the pulse 412 of the optical pump input 402 can be delayed, such as by about 10 ns, such as due to the delay portion 226. This delay is relative to receipt of the microwave signal photon 414 of the microwave signal input 404 and the resultant optical signal photon 416 of the optical signal output 406.

Figure 5:
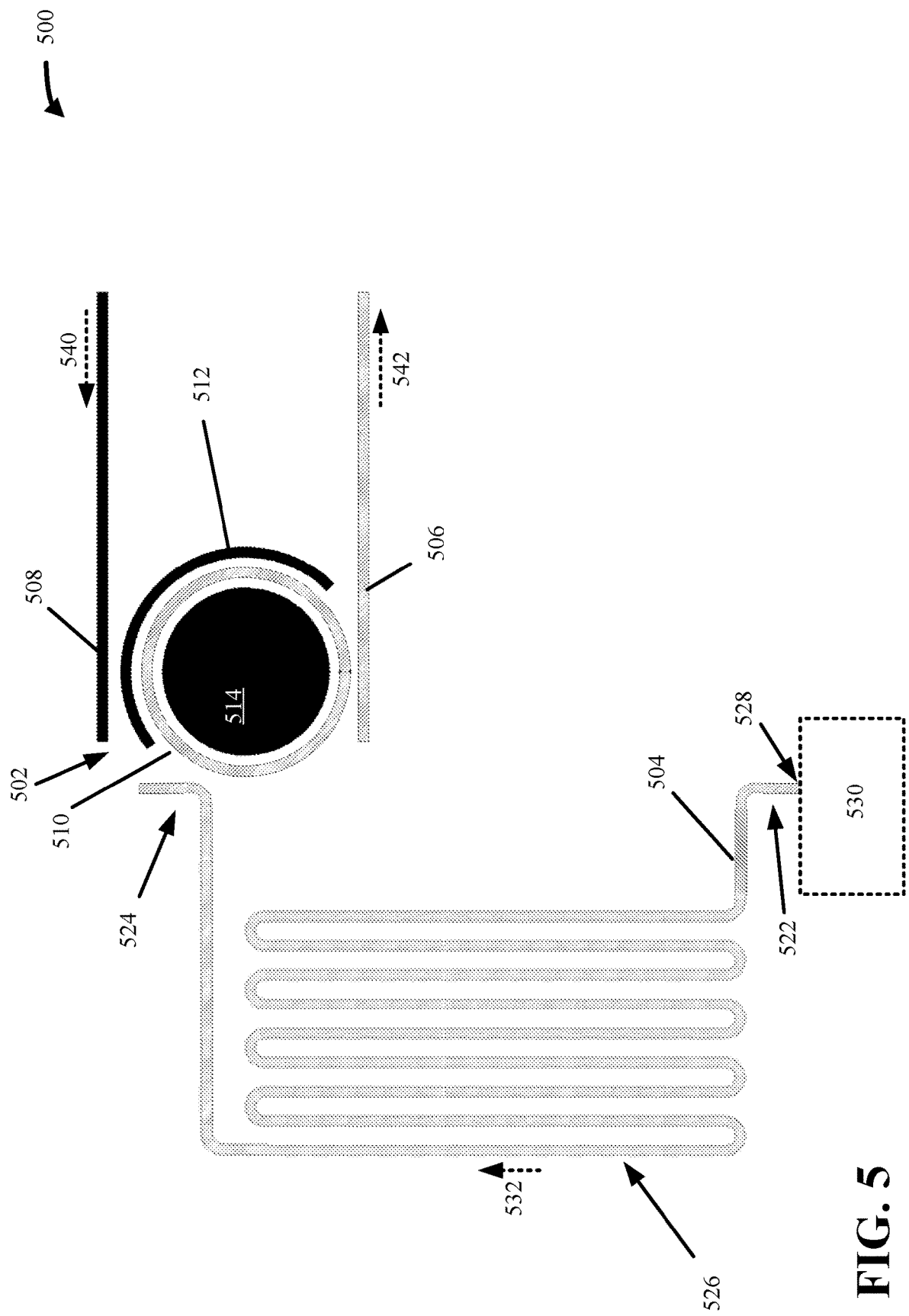
FIG. 5 illustrates another electronic structure, in accordance with one or more embodiments described herein.
Figure 7:
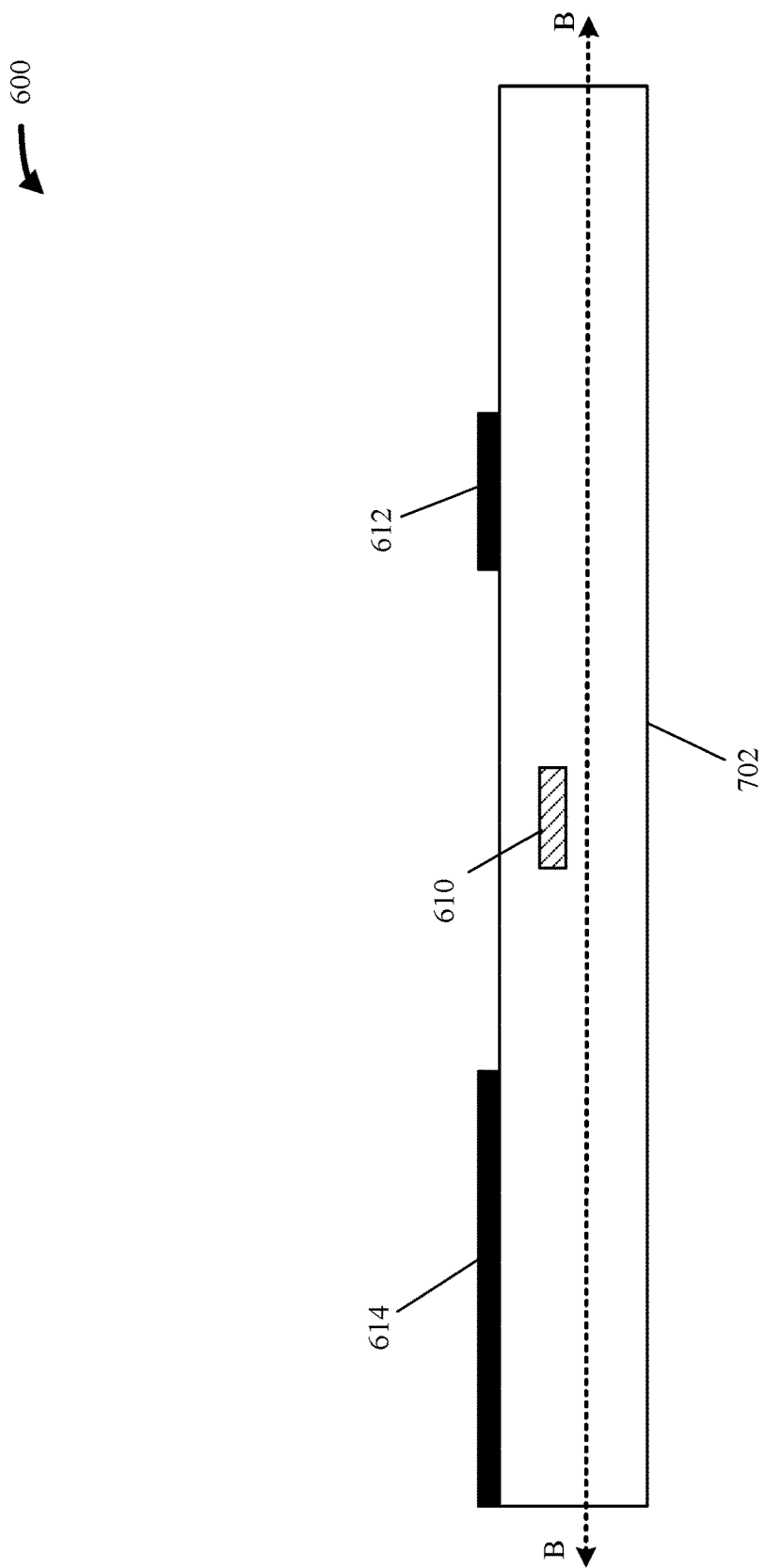
FIG. 7 illustrates another view of the electronic structure of FIG. 6, in accordance with one or more embodiments described herein.

Referring now to FIG. 5, an electronic structure 500 such as an electro-optic transducer is illustrated. FIG. 6 illustrates a top view of the electronic structure 600 while FIG. 7 illustrates a cross-sectioned partial side view of the electronic structure 600 taken at line B-B of FIG. 6. Repetitive description of like elements and/or processes employed in electronic structure embodiments 200 and/or 500 is omitted for sake of brevity.

The electronic structure 500 can comprise a substrate, resonator assembly 502, optical pump waveguide 504, microwave signal waveguide 508 and optical signal waveguide 506.

The resonator assembly 502 can comprise a microwave resonator 512 and an optical resonator 510. The optical resonator 510 can at least partially, such as fully, encircle a portion 514 of a ground plane of the electronic structure 500. The optical resonator 510 is disposed adjacent but spaced from the optical signal waveguide 506. The microwave resonator 512 can partially encircle the optical resonator 510 and is positioned adjacent, but spaced from, the microwave signal waveguide 508. The ground plane can be comprised by a superconductor of the electronic structure 500.

As illustrated by the arrows 540 and 542, the microwave signal waveguide 508 can receive a microwave signal (e.g., microwave photon) 540 for being converted to an optical signal (e.g., optical photon) 542 that is propagated away from the resonator assembly 502 by the optical signal waveguide 506. That is, the electronic structure 500 can be configured to upconvert a microwave signal to an optical domain. In one or more other embodiments, where the arrows 540 542 are reversed, the electronic structure 500 can facilitate downconversion of an optical signal to a microwave domain.

As illustrated, each of the microwave resonator 512, the optical resonator 510, the optical pump waveguide 504, the optical signal waveguide 506 and the microwave signal waveguide 508 are aligned adjacent to one another but are non-contiguous with one another. Further, as illustrated, the microwave signal waveguide 508 is completely separate from the optical pump waveguide 504. In this way, propagation of the microwave signal 540 is completely separate from propagation of an optical pump input 532 from the optical pump 530 or other source of light. It is noted that the optical pump 530 can be off-chip (e.g., off of the substrate).

An advantage of the aforementioned electronic structure 500 therefore can be an ability to separate input/output microwave signals and input/output optical signals to the resonator assembly, while also separating the optical input line from the optical pump to the resonator assembly. In this way, signal loss can be reduced and/or prevented by separate transmission lines being employed.

As illustrated, the optical pump waveguide 504 can comprise a delay portion 526 that delays receipt of the optical pump input 532 to the resonator assembly 502 through the optical pump waveguide 504. That is, upon input (e.g., coupling) of the optical pump input 532 (e.g., laser pulse) to the input end 522 of the optical pump waveguide 504 by the optical pump 530, a portion of the optical pump input 532 can scatter away from the optical pump/optical pump waveguide interface 528. This laser scatter can affect, such as couple to the ground plane 514 and/or microwave resonator 512, causing microwave resonator decoherence. It is noted that such laser scatter can be present, even with an optical coupler coupling together the optical pump waveguide 504 and the optical pump 530 at the interface 528.

Nonetheless, by integration of the delay portion 526 into the optical pump waveguide 504, propagation of the optical pump input 532 to the resonator assembly 502 (e.g., through the delay portion 526 and the optical pump waveguide 504, to the output end 524 of the optical pump waveguide 504) can be delayed to a time after reduction of a majority of decoherence of the resonator assembly 502 (e.g., of the microwave resonator 512) caused by a scattering of a portion of the optical pump input 532, which portion does not enter the optical pump waveguide 504. It is noted that the output end 524 of the optical pump waveguide 504 is disposed adjacent the resonator assembly 502, such as directly adjacent the optical resonator 510.

In one or more embodiments, delay portion 526 coupling the input end 522 of the optical pump waveguide 504 and the output end 524 of the optical pump waveguide 504 can be configured, such as shaped (e.g., by shape, dimensioning, outer periphery, outer diameter and/or length) to cause propagation of the optical pump input 532 in a time of about 10 nanoseconds (ns) or greater through the delay portion 526. This delay time can allow for the dissipation of the quasiparticles generated by the pump optical photons, which cause decoherence of the resonator assembly 502.

In one or more embodiments, such as shown at FIG. 5, the delay portion 526 can be and/or can comprise a serpentine portion. As compared to the delay portion 336 electronic structure 200 of FIG. 2, the delay portion 526 is rotated. That is, alternative shaping and/or alignment of a delay portion can adjust a delay time of the respective optical pump input through the delay portion/optical pump waveguide.

In view of the integration of the delay portion 526, an advantage of the electronic structure 500 can be an ability to allow for reduction of decoherence at the resonator assembly 502 deriving from quasiparticles created by scattering of optical pump input prior to a majority of the optical pump input 532 reaching the resonator assembly 502 through the optical pump waveguide 504.

That is, optical pump laser photons on either the superconducting transmission lines or superconducting ground plane, such as including the microwave resonator 512, microwave signal waveguide 508 and ground plane 514 can create quasiparticles, which can then negatively effect the coherence of the microwave resonator 512. Pump photons incident on the substrate do not directly create quasiparticles, but once pump photons are in the substrate, they can be directed to the superconducting structures 508, 512 and/or 514.

Accordingly, integration of the delay portion 526 can account for such negative effects to coherence of the microwave resonator 512, and as a result of the integration, can allow for use of a higher peak-power optical pulse (e.g., optical pump input 532), which in turn can increase efficiency of the electronic structure (e.g., an electro-optic transducer) 502.

Turning next to FIGS. 6 and 7, an electronic structure 600 such as an electro-optic transducer is illustrated. FIG. 6 illustrates a top view of the electronic structure 600 while FIG. 7 illustrates a cross-sectioned partial side view of the electronic structure 600 taken at line B-B of FIG. 6. Repetitive description of like elements and/or processes employed in electronic structure embodiments 200 and/or 500 is omitted for sake of brevity.

The electronic structure 600 can comprise a substrate 702, resonator assembly 602, optical pump waveguide 604, microwave signal waveguide 608 and optical signal waveguide 606.

The resonator assembly 602 can comprise a microwave resonator 612 and an optical resonator 610. The optical resonator 610 can at least partially, such as fully, encircle a portion 614 of a ground plane of the electronic structure 600. The optical resonator 610 is disposed adjacent but spaced from the optical signal waveguide 606. The microwave resonator 612 can partially encircle the optical resonator 610 and is positioned adjacent, but spaced from, the microwave signal waveguide 608. The ground plane can be comprised by a superconductor of the electronic structure 600.

As illustrated by the arrows 640 and 642, the microwave signal waveguide 208 can receive an optical signal (e.g., optical photon) 642 for being converted to a microwave signal (e.g., microwave photon) 640 that is propagated away from the resonator assembly 602 by the optical signal waveguide 606. That is, the electronic structure 600 can be configured to downconvert an optical signal to a microwave domain. In one or more other embodiments, where the arrows 640 642 are reversed, the electronic structure 600 can facilitate upconversion of a microwave signal to an optical domain.

As illustrated, each of the microwave resonator 612, the optical resonator 610, the optical pump waveguide 604, the optical signal waveguide 606 and the microwave signal waveguide 608 are aligned adjacent to one another but are non-contiguous with one another. Further, as illustrated, the microwave signal waveguide 608 is completely separate from the optical pump waveguide 604. In this way, propagation of the microwave signal 640 is completely separate from propagation of an optical pump input 632 from the optical pump 630 or other source of light. It is noted that the optical pump 630 can be off-chip (e.g., off of the substrate 702).

An advantage of the aforementioned electronic structure 600 therefore can be an ability to separate input/output microwave signals and input/output optical signals to the resonator assembly, while also separating the optical input line from the optical pump to the resonator assembly. In this way, signal loss can be reduced and/or prevented by separate transmission lines being employed.

Turning briefly to FIG. 7, in one or more embodiments, the superconductor ground plane 614 and microwave resonator 612, can be aligned at a surface of a substrate 702. The optical pump waveguide 604, optical resonator 610 and/or optical signal waveguide 606 can be embedded in the substrate 702, such as below the surface at which the superconductor ground plane 614 and microwave resonator 612 are aligned.

In one or more embodiments, the substrate 702 can comprise silicon (Si) and/or sapphire ($Al_2O_3$). The ground plane 614 and/or microwave resonator 612 are a superconducting ground plane/trace that can comprise niobium (Nb), niobium nitride (NbN) and/or niobium titanium nitride (Nb-TiN). The optical pump waveguide 604, optical signal waveguide 606 and/or optical resonator 610 can comprise a crystalline alloy of silicon and germanium in a material having a formula $Si_{1-x}Ge_x$, where x is the percentage of the alloy that is germanium (Ge).

As noted above, any one or more of these material and/or component location aspects of the electronic structure 600 can be combined with any one or more of the material and/or component location aspects of the electronic structures 200 and/or 500.

Turning again specifically to FIG. 6, as illustrated, the optical pump waveguide 604 can comprise a delay portion 626 that delays receipt of the optical pump input 632 to the resonator assembly 602 through the optical pump waveguide 604. That is, upon input (e.g., coupling) of the optical pump input 632 (e.g., laser pulse) to the input end 622 of the optical pump waveguide 604 by the optical pump 630, a portion of the optical pump input 632 can scatter away from the optical pump/optical pump waveguide interface 628. This laser scatter can affect, such as couple to the ground plane 614 and/or microwave resonator 612, causing microwave resonator decoherence. It is noted that such laser scatter can be present, even with an optical coupler coupling together the optical waveguide 604 and the optical pump 630 at the interface 628.

Nonetheless, by integration of the delay portion 626 into the optical pump waveguide 604, propagation of the optical pump input 632 to the resonator assembly 602 (e.g., through the delay portion 626 and the optical pump waveguide 604, to the output end 624 of the optical pump waveguide 604) can be delayed to a time after reduction of a majority of decoherence of the resonator assembly 602 (e.g., of the microwave resonator 612) caused by a scattering of a portion of the optical pump input 632, which portion does not enter the optical pump waveguide 604. It is noted that the output end 624 of the optical pump waveguide 604 is disposed adjacent the resonator assembly 602, such as directly adjacent the optical resonator 610.

In one or more embodiments, delay portion 626 coupling the input end 622 of the optical pump waveguide 604 and the output end 624 of the optical pump waveguide 604 can be configured, such as shaped (e.g., by shape, dimensioning, outer periphery, outer diameter and/or length) to cause propagation of the optical pump input 632 in a time of about 10 nanoseconds (ns) or greater through the delay portion 604. This delay time can allow for the dissipation of the decoherence of the resonator assembly 602.

In one or more embodiments, such as shown at FIG. 6, the delay portion 626 can be and/or can comprise a serpentine portion. Additionally, and/or alternatively, the delay portion 626 can have any other suitable shape and/or any other suitable shape orientation relative to the optical pump 630 and/or resonator assembly 602 along the substrate 702.

In view of the integration of the delay portion 626, an advantage of the electronic structure 600 can be an ability to allow for reduction of decoherence at the resonator assembly 602 deriving from quasiparticles created by scattering of optical pump input prior to a majority of the optical pump input 632 reaching the resonator assembly 602 through the optical pump waveguide 604.

That is, optical pump laser photons on either the superconducting transmission lines or superconducting ground plane, such as including the microwave resonator 612, microwave signal waveguide 608 and ground plane 614 can create quasiparticles, which can then negatively effect the coherence of the microwave resonator 612. Pump photons incident on the substrate 702 do not directly create quasiparticles, but once pump photons are in the substrate 702, they can be directed to the superconducting structures 608, 612 and/or 614.

Accordingly, integration of the delay portion 626 can account for such negative effects to coherence of the microwave resonator 612, and as a result of the integration, can allow for use of a higher peak-power optical pulse (e.g., optical pump input 632), which in turn can increase efficiency of the electronic structure (e.g., an electro-optic transducer) 602.

To provide a summary of the electronic structure 600, the electronic structure 600 can be and/or can be comprised by a transducer, such as a quantum transducer, at which a superconducting resonator 614 is coupled to an optical resonator 610 that is coupled to an off-chip source of light (e.g., optical pump 630) through an on-chip optical pump waveguide 604.

The optical pump waveguide 604 can be a low-loss integrated waveguide. For example, $Si_{1-x}Ge_x$ optical waveguides can be support optical ring resonators with intrinsic quality factors of $10^8$, corresponding to a propagation loss rate of $2*\pi*ng/(Q*\lambda_0)$, or ~1 dB/m, where ng is the group index of the optical resonator and $\lambda_0$ is the wavelength of the optical signal. As used herein, a quality factor (Q) can be a ratio of a resonance's central frequency to its linewidth.

Thus, a 10 ns delay line can result in just 1 dB of loss. Loss can refer to where a percentage of light in the optical signal waveguide 606 can be dissipated as the optical signal propagates therethrough, and thus optical energy is dissipated and is no longer within the optical mode of the optical resonator 610. For a 1 cm×1 cm transducer chip, this 10 ns delay line can result in light that is scattered into the silicon chip having approximately 100 reflections at the cleaved edges. As a result, minimal residual light can be in the Si substrate after the optical pulse 632 has propagated through the delay line 626.

Once the optical pump input 632 light has propagated through the optical delay line (e.g., optical pump waveguide 604 comprising the delay portion 626), the light reaches the optical resonator 610 which can comprise a $x^{(2)}$ or $x^{(3)}$ medium, which is coupled to a superconducting microwave resonator 614, such as by the substrate 702.

As illustrated at FIG. 6, a signal optical photon 642 can be fed into the superconducting transducer 600, timed to coincide with the arrival of the optical pulse 632. The signal optical photon 646 can then be downconverted to the microwave domain. Alternatively, such as shown at FIG. 2 or by reversing the direction of arrows 640, 642, a signal microwave photon can be fed into the transducer, timed to coincide with the arrival of the optical pump pulse 632. The signal microwave photon can then be upconverted to the optical domain.

Figure 8:
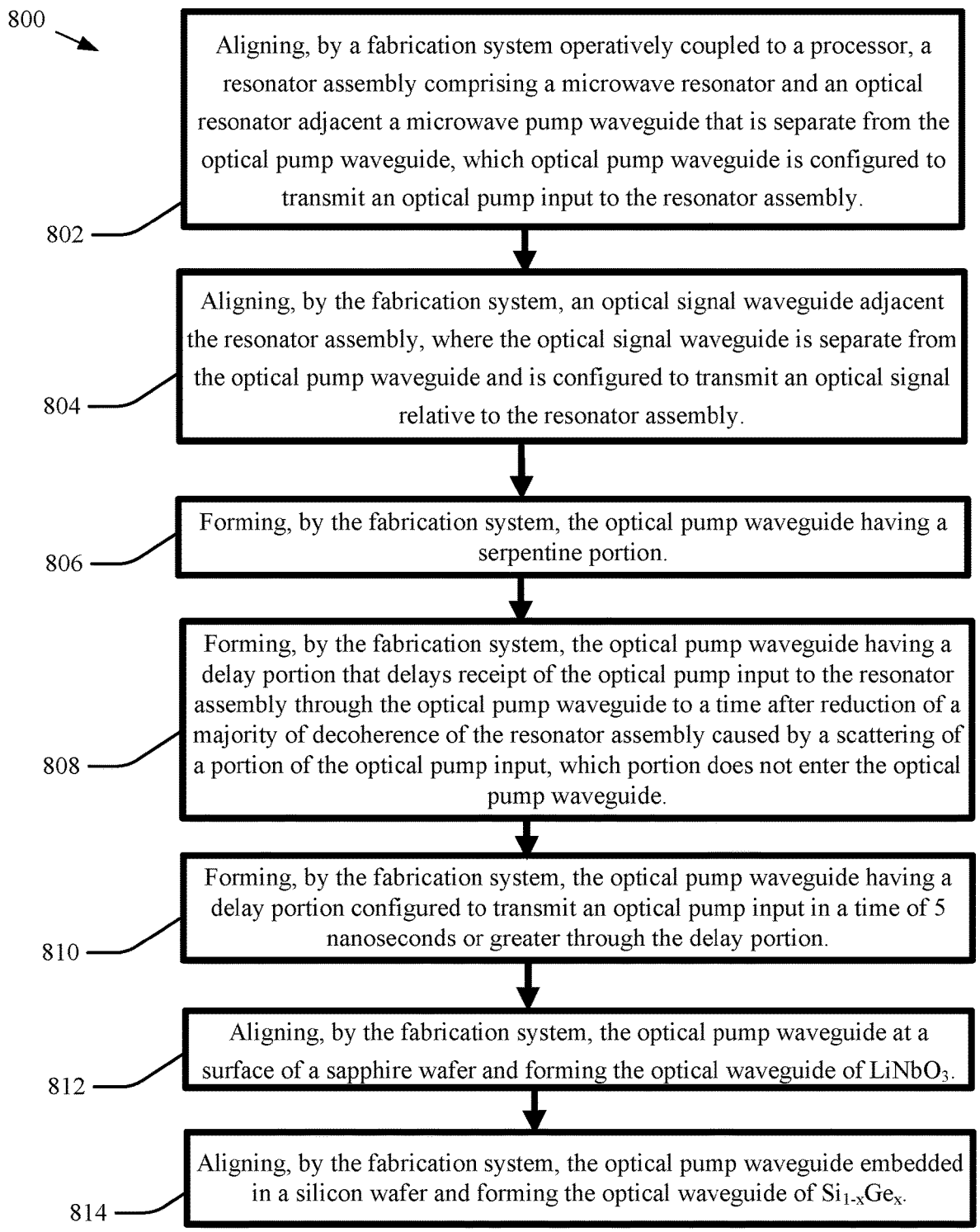
FIG. 8 illustrates a flow diagram of an example method of fabrication of an electronic structure, in accordance with one or more embodiments described herein.

Referring next to FIG. 8, illustrated is a flow diagram of an example, non-limiting method 800 that can provide a process to fabricate an electronic structure, such as the electronic structure 200, in accordance with one or more embodiments described herein. While the non-limiting method 800 is described relative to the electronic structure 200 of FIG. 2, the non-limiting method 800 can be applicable also to other structures, devices and/or systems described herein, such as any of the electronic structures 200, 500 and/or 600. Repetitive description of like elements and/or processes employed in respective embodiments is omitted for sake of brevity.

At 802, the non-limiting method 800 can comprise aligning, by a fabrication system operatively coupled to a processor (e.g., fabrication system 256), a resonator assembly comprising a microwave resonator and an optical resonator adjacent a microwave pump waveguide that is separate from the optical pump waveguide, which optical pump waveguide is configured to transmit an optical pump input to the resonator assembly.

At 804, the non-limiting method 800 can comprise aligning, by the fabrication system (e.g., fabrication system 256), an optical signal waveguide adjacent the resonator assembly, where the optical signal waveguide is separate from the optical pump waveguide and is configured to transmit an optical signal relative to the resonator assembly.

At 806, the non-limiting method 800 can comprise forming, by the fabrication system (e.g., fabrication system 256), the optical pump waveguide having a serpentine portion.

At 808, the non-limiting method 800 can comprise forming, by the fabrication system (e.g., fabrication system 256), the optical pump waveguide having a delay portion that delays receipt of the optical pump input to the resonator assembly through the optical pump waveguide to a time after reduction of a majority of decoherence of the resonator assembly caused by a scattering of a portion of the optical pump input, which portion does not enter the optical pump waveguide.

At 810, the non-limiting method 800 can comprise forming, by the fabrication system (e.g., fabrication system 256), the optical pump waveguide having a delay portion configured to transmit an optical pump input in a time of 5 nanoseconds or greater through the delay portion.

At 812, the non-limiting method 800 can comprise aligning, by the fabrication system (e.g., fabrication system 256), the optical pump waveguide at a surface of a sapphire wafer and forming the optical waveguide of $LiNbO_3$.

At 814, the non-limiting method 800 can comprise aligning, by the fabrication system (e.g., fabrication system 256), the optical pump waveguide embedded in a silicon wafer and forming the optical waveguide of $Si_{1-x}Ge_x$.

Figure 9:
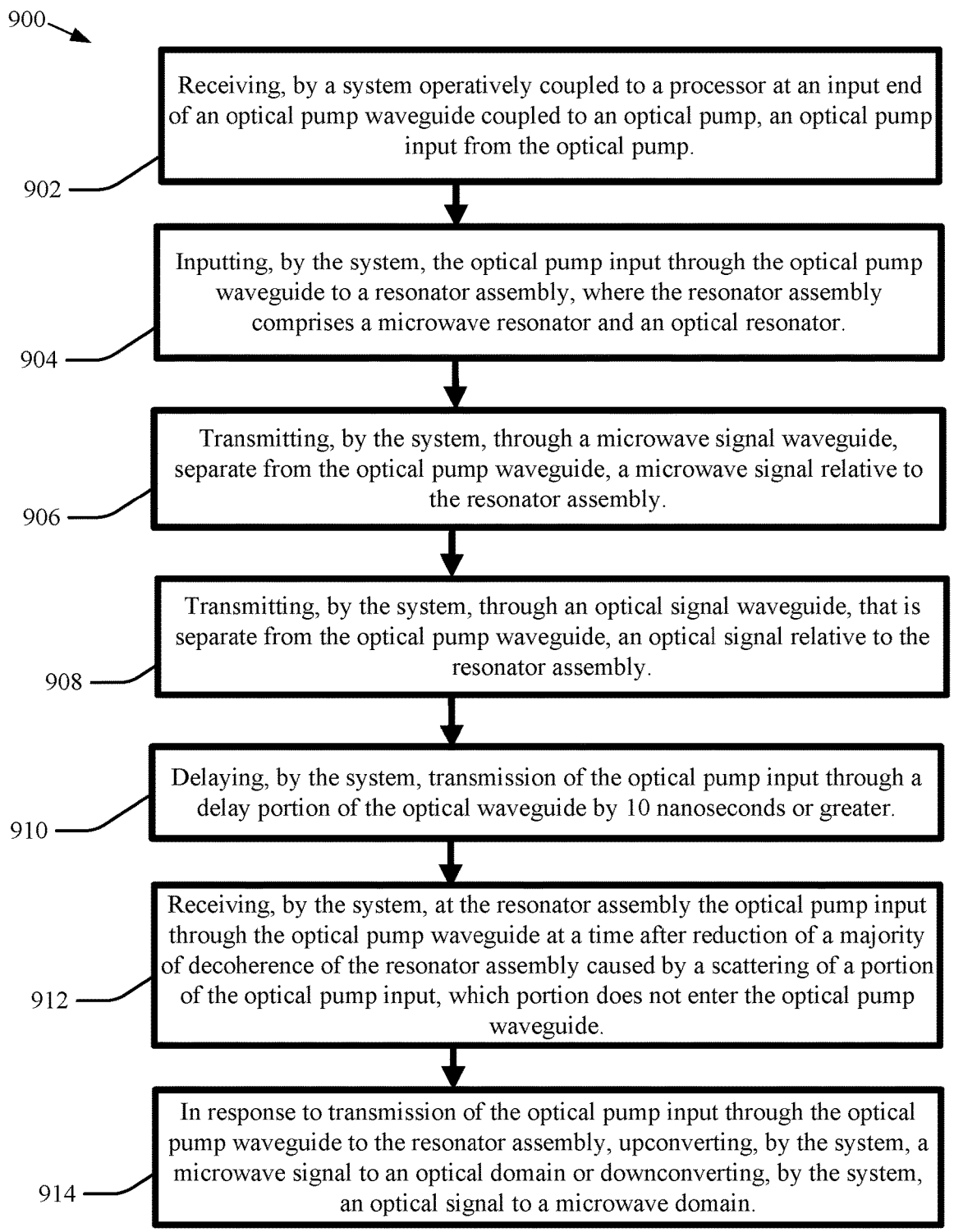
FIG. 9 illustrates a flow diagram of an example method of use of an electronic structure, in accordance with one or more embodiments described herein.

Referring next to FIG. 9, illustrated is a flow diagram of an example, non-limiting method 900 that can provide a process to use an electronic structure, such as the electronic structure 200, in accordance with one or more embodiments described herein. While the non-limiting method 900 is described relative to the electronic structure 200 of FIG. 2 in use at the non-limiting system 100, the non-limiting method 900 can be applicable also to other structures, devices and/or systems described herein, such as any of the electronic structures 200, 500 and/or 600, and/or such as a system other than comprising a quantum system. Repetitive description of like elements and/or processes employed in respective embodiments is omitted for sake of brevity.

At 902, the non-limiting method 900 can comprise receiving, by a system operatively coupled to a processor (e.g., non-limiting system 100), at an input end of an optical pump waveguide coupled to an optical pump, an optical pump input from the optical pump.

At 904, the non-limiting method 900 can comprise inputting, by the system (e.g., non-limiting system 100), the optical pump input through the optical pump waveguide to a resonator assembly, where the resonator assembly comprises a microwave resonator and an optical resonator.

At 906, the non-limiting method 900 can comprise transmitting, by the system (e.g., non-limiting system 100), through a microwave signal waveguide, separate from the optical pump waveguide, a microwave signal relative to the resonator assembly.

At 908, the non-limiting method 900 can comprise transmitting, by the system (e.g., non-limiting system 100), through an optical signal waveguide, that is separate from the optical pump waveguide, an optical signal relative to the resonator assembly.

At 910, the non-limiting method 900 can comprise delaying, by the system (e.g., non-limiting system 100), transmission of the optical pump input through a delay portion of the optical waveguide by 10 nanoseconds or greater.

At 912, the non-limiting method 900 can comprise receiving, by the system (e.g., non-limiting system 100), at the resonator assembly the optical pump input through the optical pump waveguide at a time after reduction of a majority of decoherence of the resonator assembly caused by a scattering of a portion of the optical pump input, which portion does not enter the optical pump waveguide.

At 914, the non-limiting method 900 can comprise in response to transmission of the optical pump input through the optical pump waveguide to the resonator assembly, upconverting, by the system (e.g., non-limiting system 100), a microwave signal to an optical domain or downconverting, by the system (e.g., non-limiting system 100), an optical signal to a microwave domain.

For simplicity of explanation, the computer-implemented and non-computer-implemented methodologies provided herein are depicted and/or described as a series of acts. It is to be understood that the subject innovation is not limited by the acts illustrated and/or by the order of acts, for example acts can occur in one or more orders and/or concurrently, and with other acts not presented and described herein. Furthermore, not all illustrated acts can be utilized to implement the computer-implemented and non-computer-implemented methodologies in accordance with the described subject matter. In addition, the computer-implemented and non-computer-implemented methodologies could alternatively be represented as a series of interrelated states via a state diagram or events. Additionally, the computer-implemented methodologies described hereinafter and throughout this specification are capable of being stored on an article of manufacture for transporting and transferring the computer-implemented methodologies to computers. The term article of manufacture, as used herein, is intended to encompass a computer program accessible from any computer-readable device or storage media.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

In summary, one or more devices and/or methods provided herein relate to providing conversion of photons between an optical domain and a microwave domain. An electronic structure can comprise a resonator assembly comprising a microwave resonator and an optical resonator, an optical pump waveguide that transmits an optical pump input to the resonator assembly, and an optical signal waveguide, separate from the optical pump waveguide, that transmits an optical signal relative to the resonator assembly. The electronic structure further can comprise a microwave signal waveguide that transmits a microwave signal relative to the resonator assembly. The optical pump waveguide can comprise a delay portion that delays receipt of the optical pump input to the resonator assembly through the optical pump waveguide to a time after reduction of a majority of decoherence of the resonator assembly caused by a scattering of a portion of the optical pump input, which portion does not enter the optical pump waveguide. An electronic structure comprises a resonator assembly comprising a microwave resonator and an optical resonator, an optical pump waveguide that transmits an optical pump input to the resonator assembly, and an optical signal waveguide, separate from the optical pump waveguide, that transmits an optical signal relative to the resonator assembly.

The electronic structure optionally can comprise a microwave signal waveguide that transmits a microwave signal relative to the resonator assembly.

Regarding the electronic structure of any preceding paragraph, the optical pump waveguide can optionally comprise a delay portion that delays receipt of the optical pump input to the resonator assembly through the optical pump waveguide to a time after reduction of a majority of decoherence of the resonator assembly caused by a scattering of a portion of the optical pump input, which portion does not enter the optical pump waveguide.

Regarding the electronic structure of any preceding paragraph, the optical pump waveguide can optionally comprise a serpentine portion coupling together an input of the optical pump waveguide and an output of the optical pump waveguide.

Regarding the electronic structure of any preceding paragraph, the optical pump waveguide can optionally comprise a delay portion coupling together an input of the optical pump waveguide and an output of the optical pump waveguide, and wherein the delay portion is configured to transmit an optical pump input in a time of 5 nanoseconds or greater through the delay portion.

Regarding the electronic structure of the preceding paragraph, the microwave resonator, the optical resonator, the optical pump waveguide, the optical signal waveguide and the microwave signal waveguide optionally can be aligned adjacent to one another and non-contiguous with one another.

Regarding the electronic structure of any preceding paragraph, the electronic structure can optionally be comprised by a transducer that upconverts a microwave signal to an optical domain or that downconverts an optical signal to a microwave domain.

The electronic structure of any preceding paragraph optionally can comprise the optical pump waveguide disposed at a surface of a sapphire wafer, wherein the optical pump waveguide can optionally comprise $LiNbO_3$.

The electronic structure of any preceding paragraph optionally can comprise the optical pump waveguide embedded within a silicon wafer, wherein the optical pump waveguide optionally can comprise $Si_{1-x}Ge_x$, wherein x is the percentage of Ge of the $Si_{1-x}Ge_x$.

A method for transmissively coupling a pair of devices comprises inputting an optical pump input through an optical pump waveguide to a resonator assembly, wherein the resonator assembly comprises a microwave resonator and an optical resonator, and transmitting through an optical signal waveguide, separate from the optical pump waveguide, an optical signal relative to the resonator assembly.

The method optionally can comprise receiving at the resonator assembly the optical pump input through the optical pump waveguide at a time after reduction of a majority of decoherence of the resonator assembly caused by a scattering of a portion of the optical pump input, which portion does not enter the optical pump waveguide.

The method of any preceding paragraph optionally can comprise delaying transmission of the optical pump input through a delay portion of the optical pump waveguide by 5 nanoseconds or greater.

The method of any preceding paragraph optionally can comprise in response to transmission of the optical pump input through the optical pump waveguide to the resonator assembly, upconverting a microwave signal to an optical domain or downconverting an optical signal to a microwave domain.

The method of any preceding paragraph optionally can comprise transmitting through a microwave signal waveguide a microwave signal relative to the resonator assembly.

The method of any preceding paragraph optionally can comprise receiving at an input end of an optical pump waveguide coupled to an optical pump, an optical pump input from the optical pump.

An electronic system comprises a first transducer comprising a first resonator assembly comprising a microwave resonator and an optical resonator, and a first optical pump waveguide configured to transmit only optical pump inputs to the first resonator assembly.

Regarding the electronic system, the first optical pump waveguide optionally can comprise a serpentine delay portion that is configured to transmit an optical pump input in a time of 5 nanoseconds or greater through the serpentine delay portion.

The electronic system of any preceding paragraph optionally can comprise a second transducer comprising a second resonator assembly comprising a microwave resonator and an optical resonator, and a second optical pump waveguide configured to transmit only second optical pump inputs to the second resonator assembly, and a coupling line coupling together the first resonator assembly and the second resonator assembly.

Regarding the electronic system of the preceding paragraph, the first optical pump waveguide optionally can comprise a delay portion that delays receipt of the first optical pump input to the first resonator assembly through the first optical pump waveguide, to a time after reduction of a majority of decoherence of the first resonator assembly caused by a scattering of a portion of the first optical pump input, which portion does not enter the first optical pump waveguide, and the second optical pump waveguide optionally can comprise a delay portion that delays receipt of the second optical pump input to the second resonator assembly through the second optical pump waveguide, to a time after reduction of a majority of decoherence of the second resonator assembly caused by a scattering of a portion of the second optical pump input, which portion does not enter the second optical pump waveguide.

Regarding the electronic system of any one of the two preceding paragraphs, the first transducer optionally can be coupled to a first quantum computer, and the second transducer optionally can be coupled to a second quantum computer.

An advantage of the aforementioned system, device, method of fabrication and/or method of use can be an ability to separate input/output microwave signals and input/output optical signals to the resonator assembly, while also separating the optical input line from the optical pump to the resonator assembly. In this way, signal loss can be reduced and/or prevented by separate transmission lines being employed.

Another advantage of the aforementioned system, device, method of fabrication and/or method of use can be an ability to allow for reduction of decoherence at the resonator assembly deriving from quasiparticles created by scattering of optical pump input prior to a majority of the optical pump input reaching the resonator assembly through the optical pump waveguide. This can allow for use of a higher peak-power optical pulse, which in turn can increase efficiency of the electronic structure (e.g., an electro-optic transducer).

Indeed, in view of the one or more embodiments described herein, a practical application of the system, method of fabrication and/or method of use described herein can be ability to convert a microwave photon to an optical photon, or vice versa, using a higher peak-power optical pulse than would be feasible in an existing framework. This can be because decoherence at the resonator assembly, caused by the optical pump, is allowed to diminish prior to the optical input from the optical pump reaching the resonator assembly. As a result, the respective transducer can have a higher efficiency. This is a useful and practical application of computers, thus providing enhanced (e.g., improved and/or optimized) operation of the hardware and/ or software components of a target system (e.g., quantum system) by allowing for efficient transmission between a pair of computers (e.g., a pair of quantum computers). Overall, such tools can constitute a concrete and tangible technical and/or physical improvement in the fields of electro-optic transducers and devices for conversion of photons between microwave and optical domains.

Furthermore, one or more embodiments described herein can be employed in a real-world system based on the disclosed teachings. For example, one or more electronic structure embodiments described herein can function with a quantum system that can receive as input a transmission converted by such electronic structure embodiment to the microwave domain for the quantum system and can measure a real-world qubit state of one or more qubits, such as superconducting qubits, of the quantum system, by executing a quantum source code at some level of the quantum system.

Moreover, N a device and/or method described herein can be implemented to enable scaled conversion of photons between microwave and optical domains. Indeed, use of electronic structures as described herein can be scalable, such as where plural electronic structures can be used at a single system (e.g., quantum system, radio system, waveform system and/or signal transmission system) at least partially in parallel with one another. For example, a pair of computing devices each can be associated with a respective electronic structure as described herein, to allow for transmission between the computing devices in the optical domain, but conversion from the optical domain to the microwave domain for use by the respective computing devices upon receipt of a transmission.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

Turning next to FIG. 10, a detailed description is provided of additional context for the one or more embodiments described herein at FIGS. 1-14.

FIG. 10 and the following discussion are intended to provide a brief, general description of a suitable computing environment 1000 in which one or more embodiments described herein at FIGS. 1-9 can be implemented. For example, various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 1000 contains an example of an environment for the execution of at least some of the computer code involved in performing the inventive methods, such as translation of an original source code based on a configuration of a target system by the quantum circuit execution code 2000. In addition to block 2000, computing environment 1000 includes, for example, computer 1001, wide area network (WAN) 1002, end user device (EUD) 1003, remote server 1004, public cloud 1005, and private cloud 1006. In this embodiment, computer 1001 includes processor set 1010 (including processing circuitry 1020 and cache 1021), communication fabric 1011, volatile memory 1012, persistent storage 1013 (including operating system 1022 and block 2000, as identified above), peripheral device set 1014 (including user interface (UI), device set 1023, storage 1024, and Internet of Things (IOT) sensor set 1025), and network module 1015. Remote server 1004 includes remote database 1030. Public cloud 1005 includes gateway 1040, cloud orchestration module 1041, host physical machine set 1042, virtual machine set 1043, and container set 1044.

COMPUTER 1001 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1030. As is well understood in the art of computer technology, and depending upon the technology, performance of a computer-implemented method may be distributed among multiple computers and/or between multiple locations. On the other hand, in this presentation of computing environment 1000, detailed discussion is focused on a single computer, specifically computer 1001, to keep the presentation as simple as possible. Computer 1001 may be located in a cloud, even though it is not shown in a cloud in FIG. 10. On the other hand, computer 1001 is not required to be in a cloud except to any extent as may be affirmatively indicated.

PROCESSOR SET 1010 includes one, or more, computer processors of any type now known or to be developed in the future. Processing circuitry 1020 may be distributed over multiple packages, for example, multiple, coordinated integrated circuit chips. Processing circuitry 1020 may implement multiple processor threads and/or multiple processor cores. Cache 1021 is memory that is located in the processor chip package(s) and is typically used for data or code that should be available for rapid access by the threads or cores running on processor set 1010. Cache memories are typically organized into multiple levels depending upon relative proximity to the processing circuitry. Alternatively, some, or all, of the cache for the processor set may be located "off chip." In some computing environments, processor set 1010 may be designed for working with qubits and performing quantum computing.

Computer readable program instructions are typically loaded onto computer 1001 to cause a series of operational steps to be performed by processor set 1010 of computer 1001 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1021 and the other storage media discussed below. The program instructions, and associated data, are accessed by processor set 1010 to control and direct performance of the inventive methods. In computing environment 1000, at least some of the instructions for performing the inventive methods may be stored in block 2000 in persistent storage 1013.

COMMUNICATION FABRIC 1011 is the signal conduction path that allows the various components of computer 1001 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 1012 is any type of volatile memory now known or to be developed in the future. Examples include dynamic type random access memory (RAM) or static type RAM. Typically, the volatile memory is characterized by random access, but this is not required unless affirmatively indicated. In computer 1001, the volatile memory 1012 is located in a single package and is internal to computer 1001, but, alternatively or additionally, the volatile memory may be distributed over multiple packages and/or located externally with respect to computer 1001.

PERSISTENT STORAGE 1013 is any form of non-volatile storage for computers that is now known or to be developed in the future. The non-volatility of this storage means that the stored data is maintained regardless of whether power is being supplied to computer 1001 and/or directly to persistent storage 1013. Persistent storage 1013 may be a read only memory (ROM), but typically at least a portion of the persistent storage allows writing of data, deletion of data and re-writing of data. Some familiar forms of persistent storage include magnetic disks and solid-state storage devices. Operating system 1022 may take several forms, such as various known proprietary operating systems or open-source Portable Operating System Interface type operating systems that employ a kernel. The code included in block 2000 typically includes at least some of the computer code involved in performing the inventive methods.

PERIPHERAL DEVICE SET 1014 includes the set of peripheral devices of computer 1001. Data communication connections between the peripheral devices and the other components of computer 1001 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 1023 may include components such as a display screen, speaker, microphone, wearable devices (such as goggles and smart watches), keyboard, mouse, printer, touchpad, game controllers, and haptic devices. Storage 1024 is external storage, such as an external hard drive, or insertable storage, such as an SD card. Storage 1024 may be persistent and/or volatile. In some embodiments, storage 1024 may take the form of a quantum computing storage device for storing data in the form of qubits. In embodiments where computer 1001 is required to have a large amount of storage (for example, where computer 1001 locally stores and manages a large database) then this storage may be provided by peripheral storage devices designed for storing very large amounts of data, such as a storage area network (SAN) that is shared by multiple, geographically distributed computers. IoT sensor set 1025 is made up of sensors that can be used in Internet of Things applications. For example, one sensor may be a thermometer and another sensor may be a motion detector.

NETWORK MODULE 1015 is the collection of computer software, hardware, and firmware that allows computer 1001 to communicate with other computers through WAN 1002. Network module 1015 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 1015 are performed on the same physical hardware device. In other embodiments (for example, embodiments that utilize software-defined networking (SDN)), the control functions and the forwarding functions of network module 1015 are performed on physically separate devices, such that the control functions manage several different network hardware devices. Computer readable program instructions for performing the inventive methods can typically be downloaded to computer 1001 from an external computer or external storage device through a network adapter card or network interface included in network module 1015.

WAN 1002 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 1003 is any computer system that is used and controlled by an end user (for example, a customer of an enterprise that operates computer 1001) and may take any of the forms discussed above in connection with computer 1001. EUD 1003 typically receives helpful and useful data from the operations of computer 1001. For example, in a hypothetical case where computer 1001 is designed to provide a recommendation to an end user, this recommendation would typically be communicated from network module 1015 of computer 1001 through WAN 1002 to EUD 1003. In this way, EUD 1003 can display, or otherwise present, the recommendation to an end user. In some embodiments, EUD 1003 may be a client device, such as thin client, heavy client, mainframe computer, desktop computer and so on.

REMOTE SERVER 1004 is any computer system that serves at least some data and/or functionality to computer 1001. Remote server 1004 may be controlled and used by the same entity that operates computer 1001. Remote server 1004 represents the machine(s) that collect and store helpful and useful data for use by other computers, such as computer 1001. For example, in a hypothetical case where computer 1001 is designed and programmed to provide a recommendation based on historical data, then this historical data may be provided to computer 1001 from remote database 1030 of remote server 1004.

PUBLIC CLOUD 1005 is any computer system available for use by multiple entities that provides on-demand availability of computer system resources and/or other computer capabilities, especially data storage (cloud storage) and computing power, without direct active management by the scale. The direct and active management of the computing resources of public cloud 1005 is performed by the computer hardware and/or software of cloud orchestration module 1041. The computing resources provided by public cloud 1005 are typically implemented by virtual computing environments that run on various computers making up the computers of host physical machine set 1042, which is the universe of physical computers in and/or available to public cloud 1005. The virtual computing environments (VCEs) typically take the form of virtual machines from virtual machine set 1043 and/or containers from container set 1044. It is understood that these VCEs may be stored as images and may be transferred among and between the various physical machine hosts, either as images or after instantiation of the VCE. Cloud orchestration module 1041 manages the transfer and storage of images, deploys new instantiations of VCEs and manages active instantiations of VCE deployments. Gateway 1040 is the collection of computer software, hardware, and firmware that allows public cloud 1005 to communicate through WAN 1002.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 1006 is similar to public cloud 1005, except that the computing resources are only available for use by a single enterprise. While private cloud 1006 is depicted as being in communication with WAN 1002, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1005 and private cloud 1006 are both part of a larger hybrid cloud.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein. Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general-purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function. In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented at least partially in parallel with one or more other program modules. Generally, program modules include routines, programs, components and/or data structures that perform particular tasks and/or implement particular abstract data types. Moreover, the aforedescribed computer-implemented methods can be practiced with other computer system configurations, including single-processor and/or multiprocessor computer systems, mini-computing devices, mainframe computers, as well as computers, hand-held computing devices (e.g., PDA, phone), and/or microprocessor-based or programmable consumer and/or industrial electronics. The illustrated aspects can also be practiced in distributed computing environments in which tasks are performed by remote processing devices that are linked through a communications network. However, one or more, if not all aspects of the one or more embodiments described herein can be practiced on stand-alone computers. In a distributed computing environment, program modules can be located in both local and remote memory storage devices.

As used in this application, the terms "component," "system," "platform" and/or "interface" can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random-access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the various embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:

1. An electronic structure comprising:
a resonator assembly comprising a microwave resonator and an optical resonator;
an optical pump waveguide that propagates an optical pump input to the resonator assembly, wherein the optical pump waveguide comprises a delay portion that delays receipt of the optical pump input to the resonator assembly through the optical pump waveguide to a time after reduction of a majority of decoherence of the resonator assembly caused by a scattering of a portion of the optical pump input, wherein the portion does not enter the optical pump waveguide; and
an optical signal waveguide, separate from the optical pump waveguide, that propagates an optical signal at least one of to or from the resonator assembly.

2. The electronic structure of claim 1, further comprising:
a microwave signal waveguide that propagates a microwave signal at least one of to or from the resonator assembly.

3. The electronic structure of claim 2, wherein the microwave resonator, the optical resonator, the optical pump waveguide, the optical signal waveguide, and the microwave signal waveguide are aligned adjacent to one another and are non-contiguous with one another.

4. The electronic structure of claim 2, wherein the electronic structure is comprised by a transducer that at least one of upconverts the microwave signal to an optical domain, or downconverts the optical signal to a microwave domain.

5. The electronic structure of claim 1, wherein the delay portion comprises a serpentine portion coupling together an input portion of the optical pump waveguide and an output portion of the optical pump waveguide.

6. The electronic structure of claim 1, wherein the delay portion is configured to delay the receipt of the optical pump input to the resonator assembly by at least 5 nanoseconds.

7. The electronic structure of claim 1, wherein the optical pump waveguide is disposed at a surface of a sapphire wafer, and wherein the optical pump waveguide comprises $LiNbO_3$.

8. The electronic structure of claim 1, wherein the optical pump waveguide is embedded within a silicon wafer, wherein the optical pump waveguide comprises $Si_{1-x}Ge_x$, and wherein x is a percentage of Ge of the $Si_{1-x}Ge_x$.

9. A method for transmissively coupling a pair of devices, the method comprising:
inputting an optical pump input through an optical pump waveguide to a resonator assembly, wherein the resonator assembly comprises a microwave resonator and an optical resonator, and wherein the optical pump waveguide comprises a delay portion that delays receipt of the optical pump input to the resonator assembly through the optical pump waveguide to a time after reduction of a majority of decoherence of the resonator assembly caused by a scattering of a portion of the optical pump input, wherein the portion does not enter the optical pump waveguide; and
transmitting through an optical signal waveguide, separate from the optical pump waveguide, an optical signal at least one of to or from the resonator assembly.

10. The method according to claim 9, further comprising:
receiving at the resonator assembly the optical pump input through the optical pump waveguide at the time.

11. The method according to claim 9, wherein the delay portion delays the receipt of the optical pump input to the resonator assembly by at least 5 nanoseconds.

12. The method according to claim 9, further comprising:
in response to transmission of the optical pump input through the optical pump waveguide to the resonator assembly, at least one of upconverting a microwave signal to an optical domain or downconverting the optical signal to a microwave domain.

13. The method according to claim 9, further comprising:
transmitting through a microwave signal waveguide a microwave signal at least one of to or from the resonator assembly.

14. The method according to claim 9, further comprising:
coupling an input end of the optical pump waveguide to an optical pump; and
receiving at the input end of the optical pump waveguide the optical pump input from the optical pump.

15. An electronic system, comprising:
a first transducer comprising:
a first resonator assembly comprising a first microwave resonator and a first optical resonator, and
a first optical pump waveguide configured to transmit only first optical pump inputs to the first resonator assembly, wherein the first optical pump waveguide comprises a first delay portion that delays receipt of a first optical pump input of the first optical pump inputs to the first resonator assembly through the first optical pump waveguide to a first time after reduction of a majority of decoherence of the first resonator assembly caused by a scattering of a portion of the first optical pump input, wherein the portion of the first optical pump input does not enter the first optical pump waveguide.

16. The electronic system of claim 15, wherein the first delay portion comprises a serpentine delay portion that is configured to delay the receipt of the first optical pump input to the first resonator assembly by at least 5 nanoseconds.

17. The electronic system of claim 15, further comprising:
a second transducer comprising:
a second resonator assembly comprising a second microwave resonator and a second optical resonator, and
a second optical pump waveguide configured to transmit only second optical pump inputs to the second resonator assembly; and
a coupling line coupling together the first resonator assembly and the second resonator assembly.

18. The electronic system of claim 17, wherein the second optical pump waveguide comprises a second delay portion that delays receipt of a second optical pump input of the second optical pump inputs to the second resonator assembly through the second optical pump waveguide, to a second time after reduction of a majority of decoherence of the second resonator assembly caused by a scattering of a portion of the second optical pump input, wherein the portion of the second optical pump input does not enter the second optical pump waveguide.

19. The electronic system of claim 17, wherein the first transducer is coupled to a first quantum computer, and wherein the second transducer is coupled to a second quantum computer.

20. The electronic system of claim 15, wherein the first transducer at least one of upconverts a microwave signal to an optical domain, or downconverts an optical signal to a microwave domain.

* * * * *